United States Patent
Franklin et al.

(10) Patent No.: US 12,205,638 B2
(45) Date of Patent: *Jan. 21, 2025

(54) CONCURRENT WRITE TO PROGRAMMABLE RESISTANCE MEMORY CELLS IN CROSS-POINT ARRAY

(71) Applicant: SanDisk Technologies LLC, Addison, TX (US)

(72) Inventors: Nathan Franklin, Belmont, CA (US); Ward Parkinson, Boise, ID (US); Michael Grobis, Campbell, CA (US); James O'Toole, Boise, ID (US)

(73) Assignee: SanDisk Technologies LLC, Austin, TX (US)

( * ) Notice: Subject to any disclaimer, the term of this patent is extended or adjusted under 35 U.S.C. 154(b) by 161 days.

This patent is subject to a terminal disclaimer.

(21) Appl. No.: 17/939,818

(22) Filed: Sep. 7, 2022

(65) Prior Publication Data

US 2022/0415387 A1 Dec. 29, 2022

Related U.S. Application Data

(63) Continuation of application No. 17/099,030, filed on Nov. 16, 2020, now Pat. No. 11,488,662.

(51) Int. Cl.
*G11C 11/56* (2006.01)
*G11C 11/16* (2006.01)
(Continued)

(52) U.S. Cl.
CPC ........ *G11C 11/5607* (2013.01); *G11C 11/161* (2013.01); *G11C 11/1657* (2013.01);
(Continued)

(58) Field of Classification Search
None
See application file for complete search history.

(56) References Cited

U.S. PATENT DOCUMENTS

| 6,744,663 B2 | 6/2004 | Garni et al. |
| 8,750,033 B2 | 6/2014 | Worledge |

(Continued)

FOREIGN PATENT DOCUMENTS

KR  2007094104 A * 9/2007 ......... G11C 11/5678

OTHER PUBLICATIONS

A machine translation of KR-2007094104-A (Year: 2007).*

(Continued)

*Primary Examiner* — J. H. Hur
(74) *Attorney, Agent, or Firm* — Vierra Magen Marcus LLP

(57) ABSTRACT

Concurrent access of multiple memory cells in a cross-point memory array is disclosed. In one aspect, a forced current approach is used in which, while a select voltage is applied to a selected bit line, an access current is driven separately through each selected word line to concurrently drive the access current separately through each selected memory cell. Hence, multiple memory cells are concurrently accessed. In some aspects, the memory cells are accessed using a self-referenced read (SRR), which improves read margin. Concurrently accessing more than one memory cell in a cross-point memory array improves bandwidth. Moreover, such concurrent accessing allows the memory system to be constructed with fewer, but larger cross-point arrays, which increases array efficiency. Moreover, concurrent access as disclosed herein is compatible with memory cells such as MRAM which require bipolar operation.

18 Claims, 23 Drawing Sheets

(51) Int. Cl.
　　　*H01L 23/00*　　(2006.01)
　　　*H01L 25/065*　　(2023.01)
　　　*H10B 61/00*　　(2023.01)
　　　*H10N 50/80*　　(2023.01)
　　　*H10N 50/85*　　(2023.01)

(52) U.S. Cl.
　　　CPC ...... *G11C 11/1659* (2013.01); *G11C 11/1673* (2013.01); *G11C 11/1675* (2013.01); *H01L 24/08* (2013.01); *H01L 25/0657* (2013.01); *H10B 61/10* (2023.02); *H10N 50/80* (2023.02); *H10N 50/85* (2023.02); *H01L 2224/08145* (2013.01); *H01L 2225/06506* (2013.01); *H01L 2225/06541* (2013.01); *H01L 2225/06562* (2013.01)

(56) References Cited

U.S. PATENT DOCUMENTS

| | | | |
|---|---|---|---|
| 9,218,865 | B2 | 12/2015 | Andre et al. |
| 9,653,137 | B2 | 5/2017 | Lee et al. |
| 9,697,880 | B2 | 7/2017 | Andre et al. |
| 10,211,393 | B2 | 2/2019 | Mihajlovic et al. |
| 10,373,682 | B2 | 8/2019 | Parkinson et al. |
| 10,497,438 | B2 | 12/2019 | Choi et al. |
| 10,545,692 | B2 | 1/2020 | Franklin |
| 11,488,662 | B2 * | 11/2022 | Franklin ............... H01L 25/18 |
| 2003/0123271 | A1 | 7/2003 | Wata |
| 2003/0128579 | A1 | 7/2003 | Sakimura et al. |
| 2010/0080036 | A1 * | 4/2010 | Liu ..................... G11C 11/16 365/171 |
| 2011/0292714 | A1 | 12/2011 | Andre et al. |
| 2013/0128657 | A1 | 5/2013 | Alam |
| 2013/0201754 | A1 | 8/2013 | Yu |
| 2022/0157376 | A1 | 5/2022 | Franklin et al. |

OTHER PUBLICATIONS

Chiu, Pi-Feng et al., "A Differential 2R Crosspoint RRAM Array with Zero Standby Current," IEEE Transactions on Circuits and Systems II: Express Briefs, vol. 62, Issue: 5, May 2015, 5 pages.

Zhao, W.S., et al., "Cross-point architecture for spin transfer torque magnetic random access memory," IEEE Transactions on Nanotechnology, vol. 11, Issue: 5, Sep. 2012, 9 pages.

First Action Interview Pilot Program Pre-Interview Communication dated Nov. 12, 2021, U.S. Appl. No. 17/099,030, filed Nov. 16, 2020.

First Action Interview Office Action Summary dated Dec. 29, 2021, U.S. Appl. No. 17/099,030, filed Nov. 16, 2020.

Response to Office Action dated Feb. 22, 2022, U.S. Appl. No. 17/099,030, filed Nov. 16, 2020.

Final Office Action dated JMarch 21, 2022, U.S. Appl. No. 17/099,030, filed Nov. 16, 2020.

Response to Office Action dated Jun. 15, 2022, U.S. Appl. No. 17/099,030, filed Nov. 16, 2020.

Notice of Allowance dated Jun. 27, 2022, U.S. Appl. No. 17/099,030, filed Nov. 16, 2020.

U.S. Appl. No. 17/939,826, filed Sep. 7, 2022.

Non-final Office Action dated Jul. 11, 2024, U.S. Appl. No. 17/939,826, filed Sep. 7, 2022.

Response to Office Action dated Oct. 1, 2024, U.S. Appl. No. 17/939,826, filed Sep. 7, 2022.

Notice of Allowance dated Oct. 23, 2024, U.S. Appl. No. 17/939,826, filed Sep. 7, 2022.

* cited by examiner

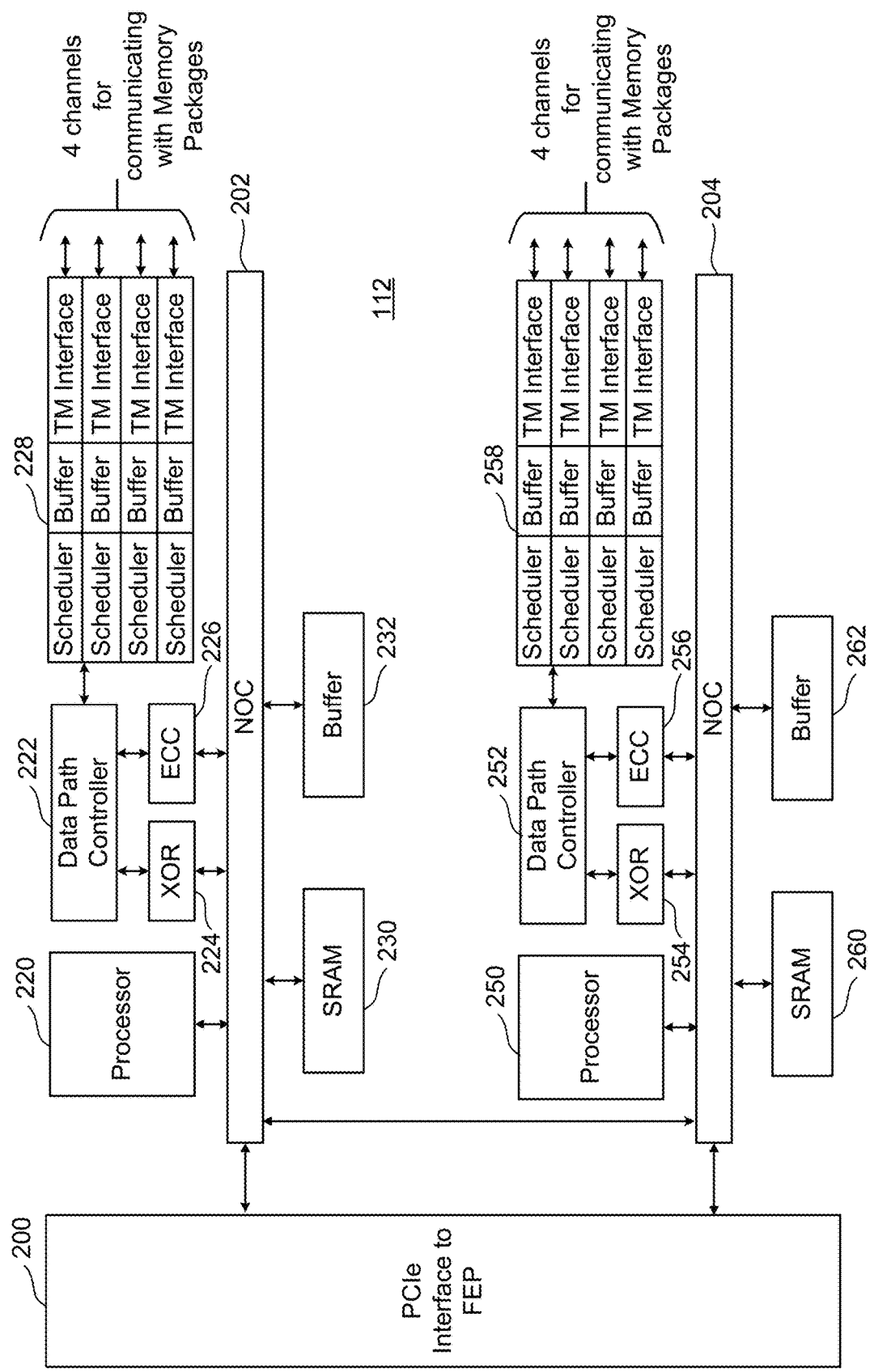

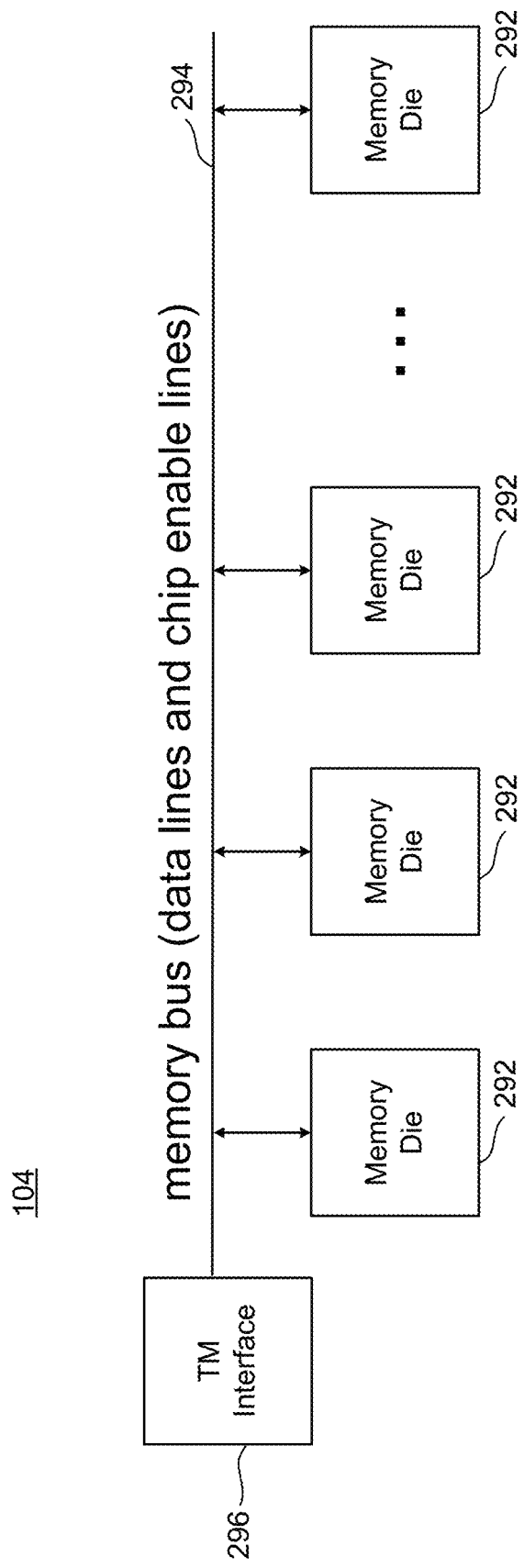

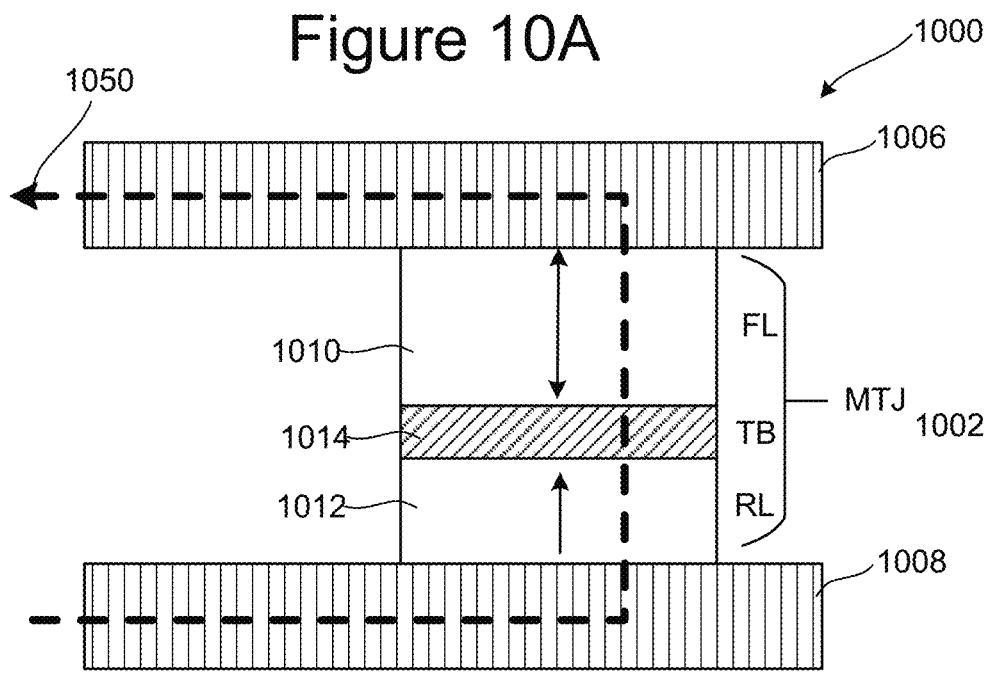
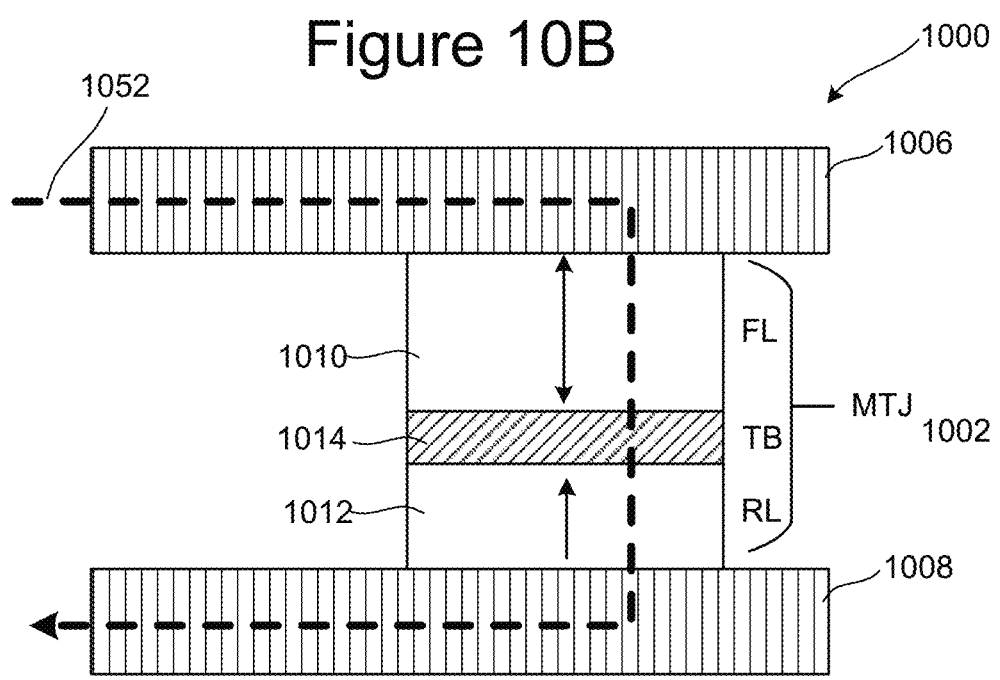

CONCURRENT WRITE TO PROGRAMMABLE RESISTANCE MEMORY CELLS IN CROSS-POINT ARRAY

CLAIM OF PRIORITY

This application is a continuation application and claims priority from U.S. patent application Ser. No. 17/099,030, entitled "CONCURRENT MULTI-BIT ACCESS IN CROSS-POINT ARRAY" by Franklin et al., filed Nov. 16, 2020, and issued as U.S. Pat. No. 11,488,662 on Nov. 1, 2022, incorporated by reference herein in its entirety.

BACKGROUND

Memory is widely used in various electronic devices such as cellular telephones, digital cameras, personal digital assistants, medical electronics, mobile computing devices, non-mobile computing devices, and data servers. Memory may comprise non-volatile memory or volatile memory. A non-volatile memory allows information to be stored and retained even when the non-volatile memory is not connected to a source of power (e.g., a battery).

In a memory array with a cross-point type architecture, a first set of conductive lines run across the surface of a substrate and a second set of conductive lines are formed over the first set of conductive lines, running over the substrate in a direction perpendicular to the first set of conductive lines. The memory cells are located at the cross-point junctions of the two sets of conductive lines. In some architectures, the memory system has multiple cross-point type arrays. In some architectures, the different cross-point type arrays can be read or written in parallel.

However, it can be quite difficult to accurately access more than one memory cell at time in a single cross-point memory array. This limits the read/write bandwidth that can be achieved for a memory system built with a cross-point architecture. Maximum bandwidth is limited to the total number of cross-point arrays in the memory system divided by the time it takes to read or write a bit (e.g., memory cell), assuming that parallel operation of separate cross-point arrays is enabled. Thus, to achieve a higher bandwidth, the memory system could be constructed with a higher number of smaller cross-point arrays. However, this works against array efficiency, which is achieved by making the individual cross-point arrays larger.

BRIEF DESCRIPTION OF THE DRAWING

Like-numbered elements refer to common components in the different figures.

FIG. 3 is a block diagram of one embodiment of a Back End Processor Circuit. In some embodiments, the Back End Processor Circuit is part of a Controller.

FIG. 4 is a block diagram of one embodiment of a memory package.

FIGS. 10A and 10B illustrate the writing of an MRAM memory cell by use of a spin torque transfer (STT) mechanism.

DETAILED DESCRIPTION

Figure 1:
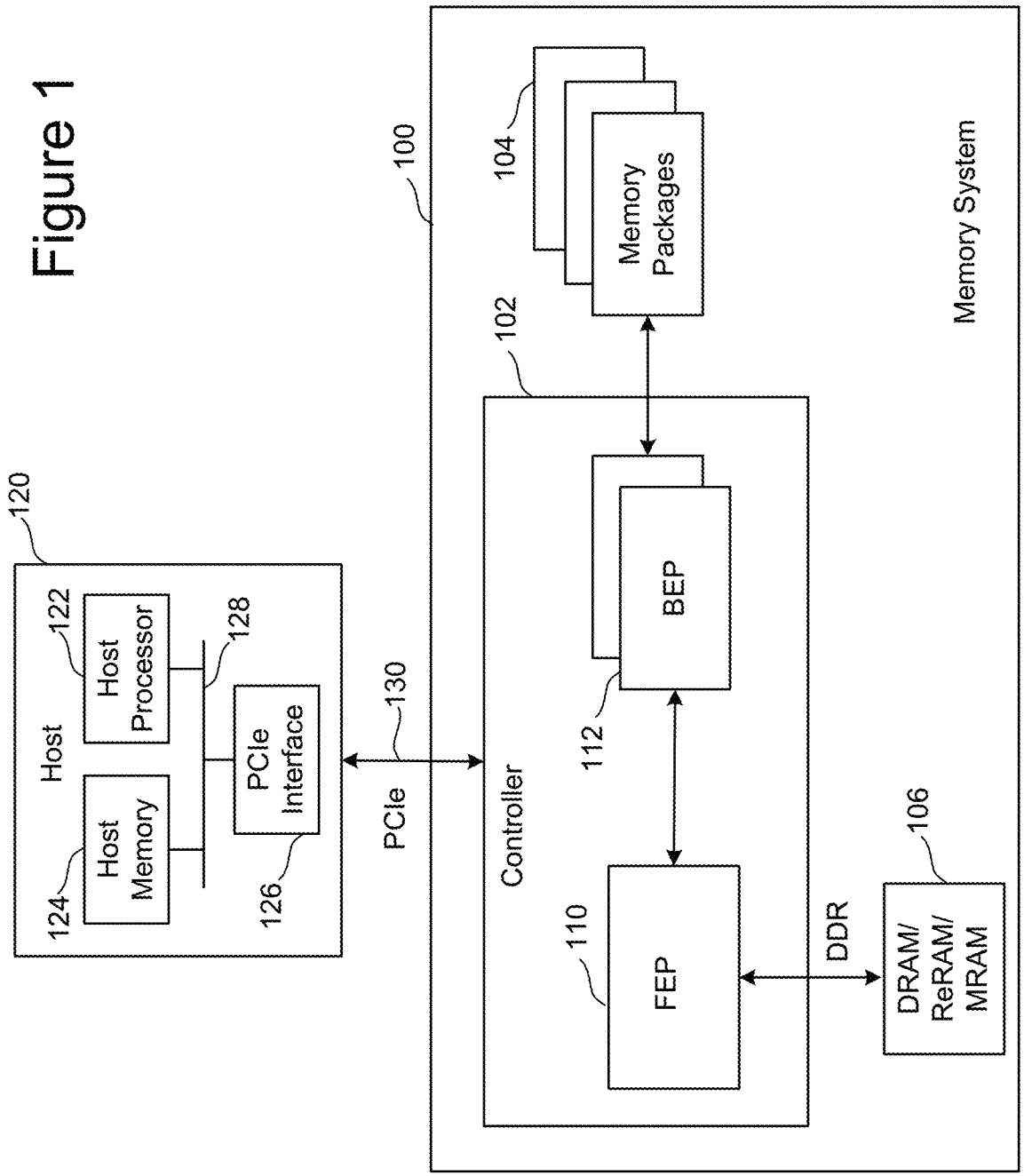
FIG. 1 is a block diagram of one embodiment of a non-volatile memory system connected to a host.

Technology is disclosed herein for concurrently accessing more than one memory cell in a cross-point memory array. In one embodiment, a control circuit concurrently accesses multiple selected memory cells in a cross-point array. In an embodiment, a forced current approach is used in which, while a select voltage is applied to a selected bit line, an access current is driven separately through each selected word line to concurrently drive the access current separately through each selected memory cell. Hence, multiple memory cells are concurrently accessed. Concurrently accessing more than one memory cell in a cross-point memory array improves bandwidth. Moreover, such concurrent accessing allows the memory system to be constructed with fewer, but larger cross-point arrays, which increases array efficiency. Moreover, concurrent access as disclosed herein is compatible with memory cells which require bipolar operation.

In some embodiments, the memory cells in the cross-point array are magnetoresistive random access memory (MRAM) cells. Hence, multiple MRAM in the same cross-point array may be concurrently accessed. An MRAM cell uses magnetization to represent stored data, in contrast to some other memory technologies that use electronic charges to store data. A bit of data is written to an MRAM cell by changing the direction of magnetization of a magnetic element within the MRAM cell, and a bit is read by measuring the resistance of the MRAM cell (low resistance typically represents a "0" bit and high resistance typically represents a "1" bit). As used herein, direction of magnetization is the direction that the magnetic moment is oriented. In some embodiments, the low resistance is referred to as a parallel or P-state and the high resistance is referred to as an anti-parallel or AP-state. MRAM typically requires bipolar operation for writes. Embodiments of concurrent write allow for bipolar operation of MRAM cells in a cross-point array. The concepts herein apply well to other technologies requiring bipolar write such as resistive random access memory (ReRAM) and ferroelectric random access memory (FeRAM), or unipolar write such as phase change memory (PCM), as well as to other selector technologies other than Ovonic Threshold Switch (OTS) described herein, such as Metal-Insulator-Semiconductor (MIS) or back-to-back transistor or Schottky diodes.

In one embodiment, multiple memory cells in a cross-point array are read concurrently. One challenge in concurrently reading multiple memory cells in a cross-point array is the read margin. For example, with an MRAM cell the read margin between the P-state and AP-state may be quite low. In one read technique, a voltage across the MRAM cell is sensed while a current is forced through the MRAM cell. The voltage difference between the P-state and AP-state might be only a few tenths of a volt. In some embodiments, the memory cells are accessed using a self-referenced read (SRR), which improves read margin. The improved read margin allows for accurate concurrent reading of multiple memory cells in a cross-point array. Note that read margin is a technical challenge for types of memory cells other than MRAM that may be used in cross-point arrays, and those challenges of other technologies can also be overcome with the techniques embodied herein.

In one embodiment, multiple memory cells in a cross-point array are written concurrently. One challenge in concurrently writing multiple memory cells in a cross-point array is that some memory cells require a bipolar write operation. For example, MRAM cells are typically written to the AP-state with one polarity and written to the P-state with the opposite polarity. The challenges of bipolar write operations has led to a focus on memory technologies that permit unipolar write operations. Embodiments of concurrent write of multiple memory cells in a cross-point array permit use of bipolar write operations, and hence permit use of memory technologies such as MRAM.

In one embodiment, in response to receiving a request to write data, a memory system identifies a first set of the MRAM cells in a cross-point array that are to store a first bit value (e.g., "0") and a second set of the MRAM cells that are to store a second bit value (e.g., "1") in order to store the data. The memory system concurrently places both the first set and the second set of MRAM cells into the AP-state. Then, the memory system concurrently places the first set of MRAM cells to the P-state while leaving the second set of MRAM cells in the AP-state. Alternatively the memory system could concurrently place both the first set and the second set of MRAM cells into the P-state, and then concurrently place the first set of MRAM cells to the AP-state while leaving the second set of MRAM cells in the P-state. Hence, concurrent write of multiple MRAM cells in a cross-point array is achieved.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable tolerance for a given application. In one embodiment, the acceptable tolerance is ±5% of a given dimension. In one embodiment, the acceptable tolerance is ±5% of a given parameter.

FIG. 1 is a block diagram of one embodiment of a non-volatile memory system (or more briefly "memory system") 100 connected to a host 120. Memory system 100 can implement the technology presented herein for concurrent multi-bit access (i.e., concurrent access of multiple memory cells) in a cross-point array. Many different types of memory systems can be used with the technology proposed herein. Example memory systems include solid state drives ("SSDs"), memory cards and embedded memory devices; however, other types of memory systems can also be used.

Memory system 100 of FIG. 1 comprises a controller 102, non-volatile memory 104 for storing data, and local memory (e.g., DRAM/ReRAM/MRAM) 106. In one embodiment, controller 102 provides for concurrent multi-bit access in a cross-point array in local memory 106. For example, controller 102 may provide for concurrent multi-bit access in a cross-point array of MRAM cells in local memory 106. The combination of the controller 102 and local memory 106 may be referred to herein as a memory system. Controller 102 comprises a Front End Processor (FEP) circuit 110 and one or more Back End Processor (BEP) circuits 112. In one embodiment FEP circuit 110 is implemented on an ASIC. In one embodiment, each BEP circuit 112 is implemented on a separate ASIC. In other embodiments, a unified controller ASIC can combine both the front end and back end functions. The ASICs for each of the BEP circuits 112 and the FEP circuit 110 are implemented on the same semiconductor such that the controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase, and programming processes.

Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, non-volatile memory 104 comprises a plurality of memory packages. Each memory package includes one or more memory die. Therefore, controller 102 is connected to one or more non-volatile memory die. In one embodiment, each memory die in the memory packages 104 utilize NAND flash memory (including two dimensional NAND flash memory and/or three dimensional NAND flash memory). In other embodiments, the memory package can include other types of memory, such as storage class memory (SCM) based on resistive random access memory (such as ReRAM, MRAM, FeRAM or RRAM) or a phase change memory (PCM). In one embodiment, control logic provides for concurrent multi-bit access in a cross-point array in a memory package 104. For example, control logic within a memory package 104 may provide for concurrent multi-bit access in a cross-point array of MRAM cells in a memory package 104.

Controller 102 communicates with host 120 via an interface 130 that implements a protocol like, for example, Compute Express Link (CXL). For working with memory system 100, host 120 includes a host processor 122, host memory 124, and a PCIe interface 126 connected along bus 128. Host memory 124 is the host's physical memory, and can be DRAM, SRAM, MRAM, non-volatile memory, or another type of storage. Host 120 is external to and separate from memory system 100. In one embodiment, memory system 100 is embedded in host 120. One embodiment includes concurrent multi-bit access in a cross-point array in host memory 124. For example, host processor 122 may provide for concurrent multi-bit access in a cross-point array of MRAM cells in host memory 124. The combination of the host processor 122 and host memory 124 may be referred to herein as a memory system.

Figure 2:
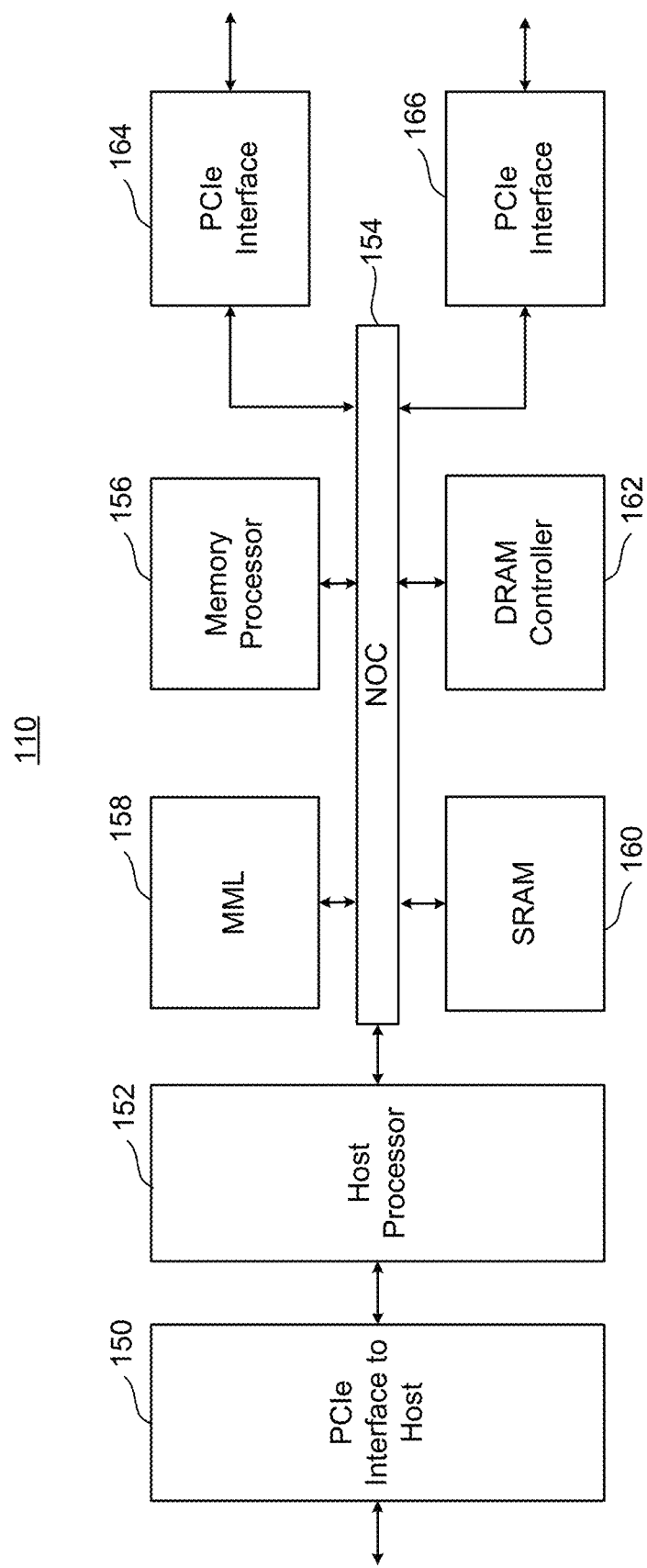
FIG. 2 is a block diagram of one embodiment of a Front End Processor Circuit. In some embodiments, the Front End Processor Circuit is part of a Controller.

FIG. 2 is a block diagram of one embodiment of FEP circuit 110. FIG. 2 shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. In one embodiment, there is an MRAM controller to operate and communicate with the MRAM (e.g., MRAM 106). In one embodiment, the MRAM controller provides for concurrent multi-bit access in a cross-point array of MRAM cells in MRAM 106. Memory processor 156 is used to run the FEP circuit and perform the various memory operations. Also, in communication with the NOC are two PCIe Interfaces 164 and 166. In the embodiment of FIG. 2, the SSD controller will include two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

FEP circuit 110 can also include a Media Management Layer (MML) 158 that performs memory management (e.g., garbage collection, wear leveling, load balancing, etc.), logical to physical address translation, communication with the host, management of DRAM (local volatile memory) and management of the overall operation of the SSD or other non-volatile storage system. The media management layer MML 158 may be integrated as part of the memory management that may handle memory errors and interfacing with the host. In particular, MML may be a module in the FEP circuit 110 and may be responsible for the internals of memory management. In particular, the MML 158 may include an algorithm in the memory device firmware which translates writes from the host into writes to the memory structure (e.g., 502 of FIGS. 5A and 5B below) of a die. The MML 158 may be needed because: 1) the memory may have limited endurance; 2) the memory structure may only be written in multiples of pages; and/or 3) the memory structure may not be written unless it is erased as a block. The MML 158 understands these potential limitations of the memory structure which may not be visible to the host. Accordingly, the MML 158 attempts to translate the writes from host into writes into the memory structure.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined into one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 222 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer, and TM Interface for each of the channels. The processor can be any standard processor known in the art. The data path controllers 222/252 can be a processor, FPGA, microprocessor, or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

FIG. 4 is a block diagram of one embodiment of a memory package 104 that includes a plurality of memory die 292 connected to a memory bus (data lines and chip enable lines) 294. The memory bus 294 connects to a Toggle Mode Interface 296 for communicating with the TM Interface of a BEP circuit 112 (see e.g., FIG. 3). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

Figure 5A:
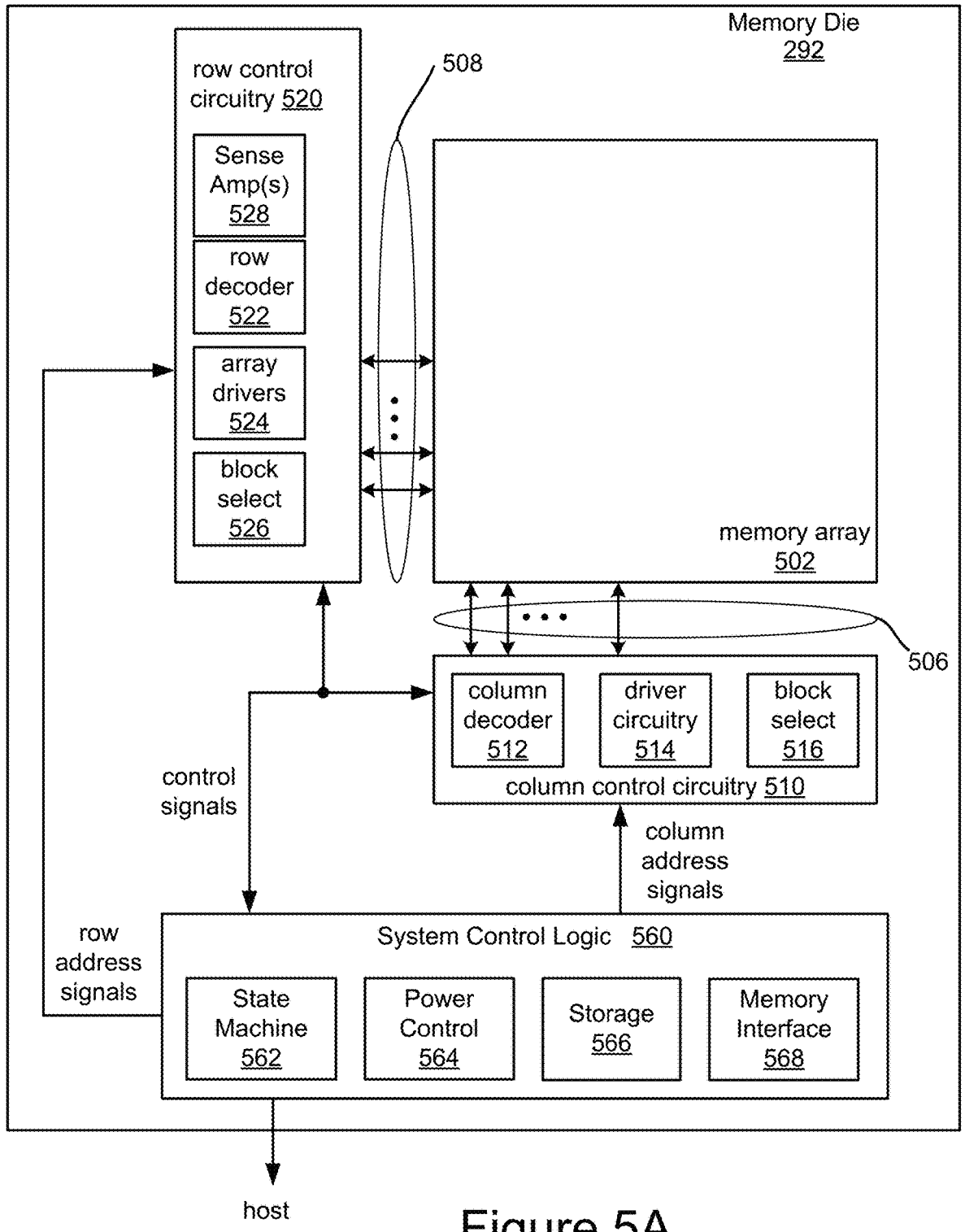
FIG. 5A is a block diagram of one embodiment of a memory die.

FIG. 5A is a block diagram that depicts one example of a memory die 292 that can implement the technology described herein. Memory die 292 includes a memory array 502 that can include any of memory cells described in the following. The array terminal lines of memory array 502 include the various layer(s) of word lines organized as rows, and the various layer(s) of bit lines organized as columns. However, other orientations can also be implemented. Memory die 292 includes row control circuitry 520, whose outputs 508 are connected to respective word lines of the memory array 502. Row control circuitry 520 receives a group of M row address signals and one or more various control signals from System Control Logic circuit 560, and typically may include such circuits as row decoders 522, array terminal drivers 524, and block select circuitry 526 for both reading and writing operations. Row control circuitry 520 may also include read/write circuitry. In an embodiment, row control circuitry 520 has sense amplifiers 528, which each contain circuitry for sensing a condition (e.g., voltage) of a word line of the memory array 502. In an embodiment, by sensing a word line voltage, a condition of a memory cell in a cross-point array is determined. Memory die 292 also includes column control circuitry 510 whose input/outputs 506 are connected to respective bit lines of the memory array 502. Although only single block is shown for array 502, a memory die can include multiple arrays or "tiles" that can be individually accessed. Column control circuitry 510 receives a group of N column address signals and one or more various control signals from System Control Logic 560, and typically may include such circuits as column decoders 512, array terminal receivers or drivers 514, block select circuitry 516, as well as read/write circuitry, and I/O multiplexers.

System control logic 560 receives data and commands from a host and provides output data and status to the host. In other embodiments, system control logic 560 receives data and commands from a separate controller circuit and provides output data to that controller circuit, with the controller circuit communicating with the host. In some embodiments, the system control logic 560 can include a state machine 562 that provides die-level control of memory operations. In one embodiment, the state machine 562 is programmable by software. In other embodiments, the state machine 562 does not use software and is completely implemented in hardware (e.g., electrical circuits). In another embodiment, the state machine 562 is replaced by a micro-controller or microprocessor. The system control logic 560 can also include a power control module 564 controls the power and voltages supplied to the rows and columns of the memory 502 during memory operations and may include charge pumps and regulator circuit for creating regulating voltages. System control logic 560 includes storage 566, which may be used to store parameters for operating the memory array 502.

Commands and data are transferred between the controller 102 and the memory die 292 via memory controller interface 568 (also referred to as a "communication interface"). Memory controller interface 568 is an electrical interface for communicating with memory controller 102. Examples of memory controller interface 568 include a Toggle Mode Interface and an Open NAND Flash Interface (ONFI). Other I/O interfaces can also be used. For example, memory controller interface 568 may implement a Toggle Mode Interface that connects to the Toggle Mode interfaces of memory interface 228/258 for memory controller 102. In one embodiment, memory controller interface 568 includes a set of input and/or output (I/O) pins that connect to the controller 102. In another embodiment, the interface is JEDEC standard DDRn or LPDDRn, such as DDR5 or LPDDR5, or a subset thereof with smaller page and/or relaxed timing.

In some embodiments, all of the elements of memory die 292, including the system control logic 560, can be formed as part of a single die. In other embodiments, some or all of the system control logic 560 can be formed on a different die.

In one embodiment, memory structure 502 comprises a three dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping.

In another embodiment, memory structure 502 comprises a two dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 502 is not limited to the examples above. Many different types of memory array architectures or memory technologies can be used to form memory structure 326. No particular non-volatile memory technology is required for purposes of the new claimed embodiments proposed herein. Other examples of suitable technologies for memory cells of the memory structure 502 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 502 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive random access memory (MRAM) stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). The memory cells are programmed by current pulses that can change the co-ordination of the PCM material or switch it between amorphous and crystalline states. Note that the use of "pulse" in this document does not require a square pulse but includes a (continuous or non-continuous) vibration or burst of sound, current, voltage light, or other wave.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 5A can be grouped into two parts, the structure of memory structure 502 of the memory cells and the peripheral circuitry, including all of the other elements. An important characteristic of a memory circuit is its capacity, which can be increased by increasing the area of the memory die of memory die 292 that is given over to the memory structure 502; however, this reduces the area of the memory die available for the peripheral circuitry. This can place quite severe restrictions on these peripheral elements. For example, the need to fit sense amplifier circuits within the available area can be a significant restriction on sense amplifier design architectures. With respect to the system control logic 560, reduced availability of area can limit the available functionalities that can be implemented on-chip. Consequently, a basic trade-off in the design of a memory die 292 is the amount of area to devote to the memory structure 502 and the amount of area to devote to the peripheral circuitry.

Another area in which the memory structure 502 and the peripheral circuitry are often at odds is in the processing involved in forming these regions, since these regions often involve differing processing technologies and the trade-off in having differing technologies on a single die. For example, when the memory structure 502 is NAND flash, this is an NMOS structure, while the peripheral circuitry is often CMOS based. For example, elements such sense amplifier circuits, charge pumps, logic elements in a state machine, and other peripheral circuitry in system control logic 560 often employ PMOS devices. Processing operations for manufacturing a CMOS die will differ in many aspects from the processing operations optimized for an NMOS flash NAND memory or other memory cell technologies.

Figure 5B:
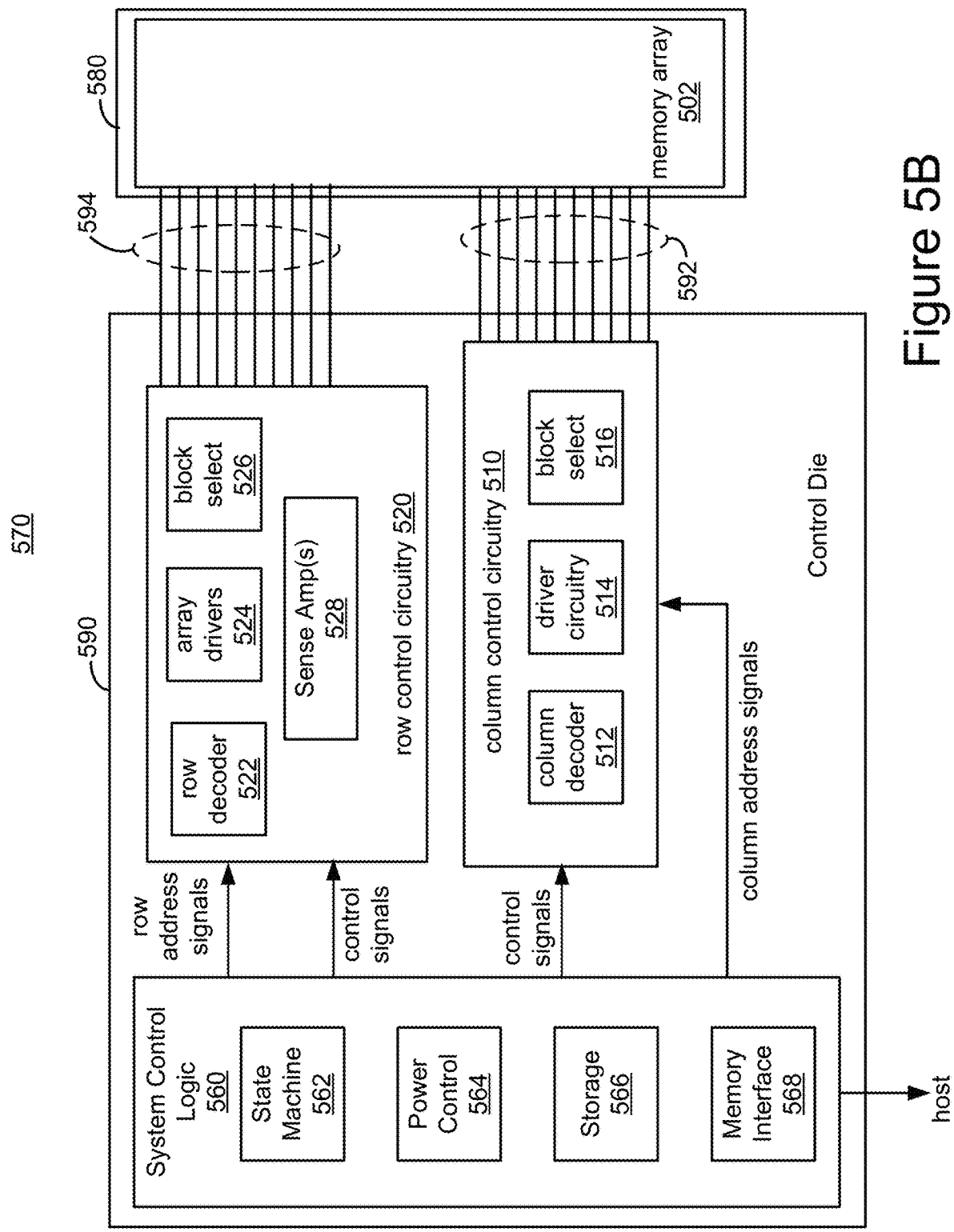
FIG. 5B is a block diagram of one embodiment of an integrated memory assembly containing a control die and a memory structure die.

To improve upon these limitations, embodiments described below can separate the elements of FIG. 5A onto separately formed dies that are then bonded together. FIG. 5B depicts an integrated memory assembly 570 having a memory structure die 580 and a control die 590. The memory structure 502 is formed on the memory structure die 580 and some or all of the peripheral circuitry elements, including one or more control circuits, are formed on the control die 590. For example, a memory structure die 580 can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to the control die. This allows each of the semiconductor dies to be optimized individually according to its technology. For example, a NAND memory die can be optimized for an NMOS based memory array structure, with a separate peripheral circuitry die (or "control die") being optimized for CMOS elements and CMOS processing. This allows more space for the peripheral elements, which can now incorporate additional capabilities that could not be readily incorporated were they restricted to the margins of the same die holding the memory cell array. The two die can then be bonded together in a bonded multi-die integrated memory assembly, with the array on the one die connected to the periphery elements on the other die. Although the following will focus on an integrated memory assembly of one memory die and one control die, other embodiments can use additional dies, such as two memory dies and one control die, for example.

As with 502 of FIG. 5A, the memory die 580 in FIG. 5B can include multiple independently accessible arrays or "tiles." It can be seen that system control logic 560, row control circuitry 520, and column control circuitry 510 are located in control die 590. In some embodiments, all or a portion of the column control circuitry 510 and all or a portion of the row control circuitry 520 are located on the memory structure die 580. In some embodiments, some of the circuitry in the system control logic 560 is located on the on the memory structure die 580.

System control logic 560, row control circuitry 520, and column control circuitry 510 may be formed by a common process (e.g., CMOS process), so that adding elements and functionalities more typically found on a memory controller 102 may require few or no additional process steps (i.e., the same process steps used to fabricate controller 102 may also be used to fabricate system control logic 560, row control circuitry 520, and column control circuitry 510). Thus, while moving such circuits from a die such as memory die 292 may reduce the number of steps needed to fabricate such a die, adding such circuits to a die such as control die 590 may not require any additional process steps.

FIG. 5B shows column control circuitry 510 on the control die 590 coupled to memory structure 502 on the memory structure die 580 through electrical paths 592. For example, electrical paths 592 may provide electrical connection between column decoder 512, driver circuitry 514, and block select 516 and bit lines of memory structure 502. Electrical paths may extend from column control circuitry 510 in control die 590 through pads on control die 590 that are bonded to corresponding pads of the memory structure die 580, which are connected to bit lines of memory structure 502. Each bit line of memory structure 502 may have a corresponding electrical path in electrical paths 592, including a pair of bond pads, which connects to column control circuitry 510. Similarly, row control circuitry 520, including row decoder 522, array drivers 524, block select 526, and sense amplifiers 528 are coupled to memory structure 502 through electrical paths 594. Each of electrical path 594 may correspond to a word line, dummy word line, or select gate line. Additional electrical paths may also be provided between control die 590 and memory die 580.

For purposes of this document, the phrase "a control circuit" can include one or more of controller 102, system control logic 560, column control circuitry 510, row control circuitry 520, a micro-controller, a state machine, host processor 122, and/or other control circuitry, or other analogous circuits that are used to control non-volatile memory. The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit. Such control circuitry may include drivers such as direct drive via connection of a node through fully on transistors (gate to the power supply) driving to a fixed voltage such as a power supply. Such control circuitry may include a current source driver where a transistor in the path is partially on and controlled by a current mirror to limit current to fixed amount, such as a read current, or write forward or write reverse current.

For purposes of this document, the term "apparatus" can include, but is not limited to, one or more of host 120, the combination of host processor 122 and host memory 124, memory system 100, controller 102, the combination of controller 102 and local memory 106, memory package 104, integrated memory assembly 570, and/or control die 590.

In the following discussion, the memory array 502 of FIGS. 5A and 5B will be discussed in the context of a cross-point architecture. In a cross-point architecture, a first set of conductive lines or wires, such as word lines, run in a first direction relative to the underlying substrate and a second set of conductive lines or wires, such a bit lines, run in a second relative to the underlying substrate. The memory cells are sited at the intersection of the word lines and bit lines. The memory cells at these cross-points can be formed according to any of a number of technologies, including those described above. The following discussion will mainly focus on embodiments based on a cross-point architecture using MRAM memory cells, each in series with a selector such as Ovonic Threshold Switch (OTS) to comprise a selectable memory bit.

Figure 6A:
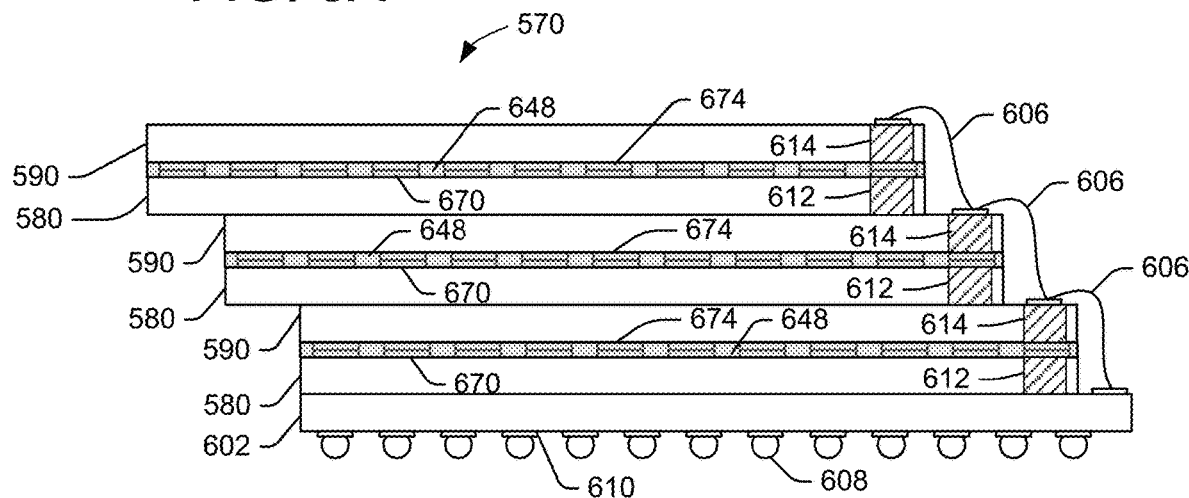
FIG. 6A depicts a side view of an embodiment of an integrated memory assembly stacked on a substrate.

In some embodiments, there is more than one control die 590 and more than one memory structure die 580 in an integrated memory assembly 570. In some embodiments, the integrated memory assembly 570 includes a stack of multiple control dies 590 and multiple memory structure dies 580. FIG. 6A depicts a side view of an embodiment of an integrated memory assembly 570 stacked on a substrate 602 (e.g., a stack comprising control dies 590 and memory structure dies 580). The integrated memory assembly 570 has three control dies 590 and three memory structure dies 580. In some embodiments, there are more than three memory structure dies 580 and more than three control dies 590.

Each control die 590 is affixed (e.g., bonded) to at least one of the memory structure dies 580. Each control die 590 has a number of bond pads 674 on a major surface of the control die 590. Each memory structure die 580 has a number of bond pads 670 on a major surface of the memory structure die 580. Note that there are bond pad pairs 670/674. In one embodiment, the pattern of bond pads 670 matches the pattern of bond pads 674. In some embodiments, bond pads 670 and/or 674 are flip-chip bond pads. Thus, the bond pads 670, 674 electrically and physically couple the memory die 580 to the control die 590. Also, the bond pads 670, 674 permit internal signal transfer between the memory die 580 and the control die 590. Thus, the memory die 580 and the control die 590 are bonded together with bond pads.

The bond pads 670, 674 may be formed for example of copper, aluminum, and alloys thereof. There may be a liner 648 between the bond pads 670, 674 and the major surfaces. The liner may be formed for example of a titanium/titanium nitride stack. The bond pads 670, 674 and liner may be applied by vapor deposition and/or plating techniques. The bond pads and liners together may have a thickness of 720 nm, though this thickness may be larger or smaller in further embodiments.

The bond pads allow for internal signal transfer. Herein, "internal signal transfer" means signal transfer between the control die 590 and the memory die 580. The internal signal transfer permits the circuitry on the control die 590 to control memory operations in the memory die 580. Therefore, the bond pads 670, 674 may be used for memory operation signal transfer. Herein, "memory operation signal transfer" refers to any signals that pertain to a memory operation in a memory die 580. A memory operation signal transfer could include, but is not limited to, providing a voltage, providing a current, receiving a voltage, receiving a current, sensing a voltage, and/or sensing a current.

There may be many more bond pads than depicted in FIG. 6A. A space between two dies 580, 590 that are bonded together is filled with a solid layer 648, which may be formed from epoxy or other resin or polymer. This solid layer 648 protects the electrical connections between the dies 580, 590, and further secures the dies together. Various materials may be used as solid layer 648, but in embodiments, it may be Hysol epoxy resin from Henkel Corp., having offices in California, USA.

The integrated memory assembly 570 may for example be stacked with a stepped offset, leaving the bond pads at each level uncovered and accessible from above. Wire bonds 606 connected to the bond pads connect the control die 590 to the substrate 602. A number of such wire bonds may be formed across the width of each control die 590 (i.e., into the page of FIG. 6A).

A memory structure die through silicon via (TSV) 612 may be used to route signals through a memory structure die 580. A control die through silicon via (TSV) 614 may be used to route signals through a control die 590. The TSVs 612, 614 may be formed before, during or after formation of the integrated circuits in the semiconductor dies 580, 590. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 608 may optionally be affixed to contact pads 610 on a lower surface of substrate 602. The solder balls 608 may be used to electrically and mechanically couple the integrated memory assembly 570 to a host device such as a printed circuit board. Solder balls 608 may be omitted where the integrated memory assembly 570 is to be used as an LGA package. The solder balls 608 may form a part of the interface between the integrated memory assembly 570 and the memory controller 102.

Figure 6B:
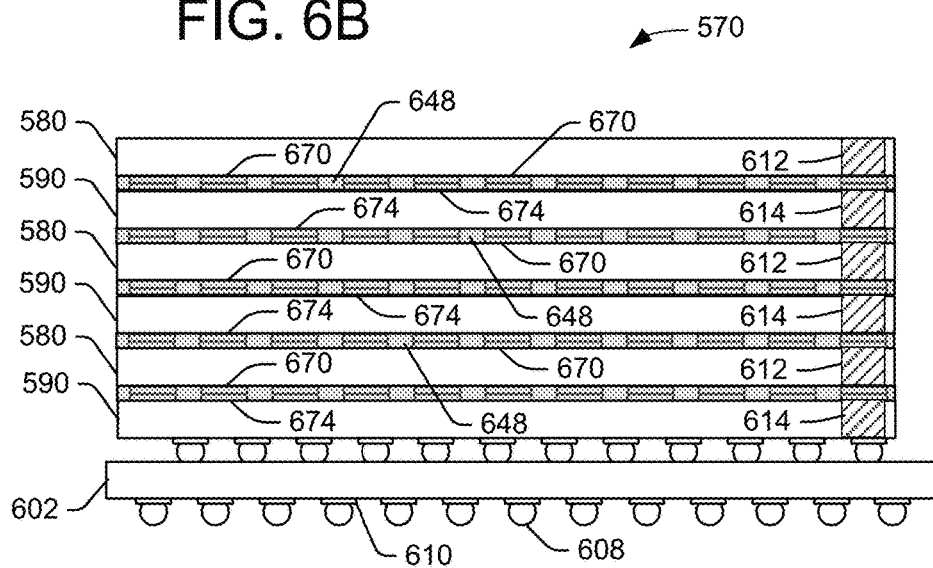
FIG. 6B depicts a side view of an embodiment of an integrated memory assembly stacked on a substrate.

FIG. 6B depicts a side view of an embodiment of an integrated memory assembly 570 stacked on a substrate 602. The integrated memory assembly 570 has three control dies 590 and three memory structure dies 580. In some embodiments, there are many more than three memory structure dies 580 and many more than three control dies 590. In this example, each control die 590 is bonded to at least one memory structure die 580. Optionally, a control die 590 may be bonded to two memory structure die 580.

Some of the bond pads 670, 674 are depicted. There may be many more bond pads. A space between two dies 580, 590 that are bonded together is filled with a solid layer 648, which may be formed from epoxy or other resin or polymer. In contrast to the example in FIG. 6A, the integrated memory assembly 570 in FIG. 6B does not have a stepped offset. A memory structure die through silicon via (TSV) 612 may be used to route signals through a memory structure die 580. A control die through silicon via (TSV) 614 may be used to route signals through a control die 590.

Solder balls 608 may optionally be affixed to contact pads 610 on a lower surface of substrate 602. The solder balls 608 may be used to electrically and mechanically couple the integrated memory assembly 570 to a host device such as a printed circuit board. Solder balls 608 may be omitted where the integrated memory assembly 570 is to be used as an LGA package.

As has been briefly discussed above, the control die 590 and the memory structure die 580 may be bonded together. Bond pads on each die 580, 590 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 6 μm square and spaced from each other with a pitch of 6 μm to 6 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 6 μm square and spaced from each other with a pitch of 1 μm to 6 μm. Bonding techniques may be used providing bond pads with even smaller sizes and pitches.

Some embodiments may include a film on surface of the dies 580, 590. Where no such film is initially provided, a space between the dies may be under filled with an epoxy or other resin or polymer. The under-fill material may be applied as a liquid which then hardens into a solid layer. This under-fill step protects the electrical connections between the dies 580, 590, and further secures the dies together. Various materials may be used as under-fill material, but in embodiments, it may be Hysol epoxy resin from Henkel Corp., having offices in California, USA.

Figure 7A:
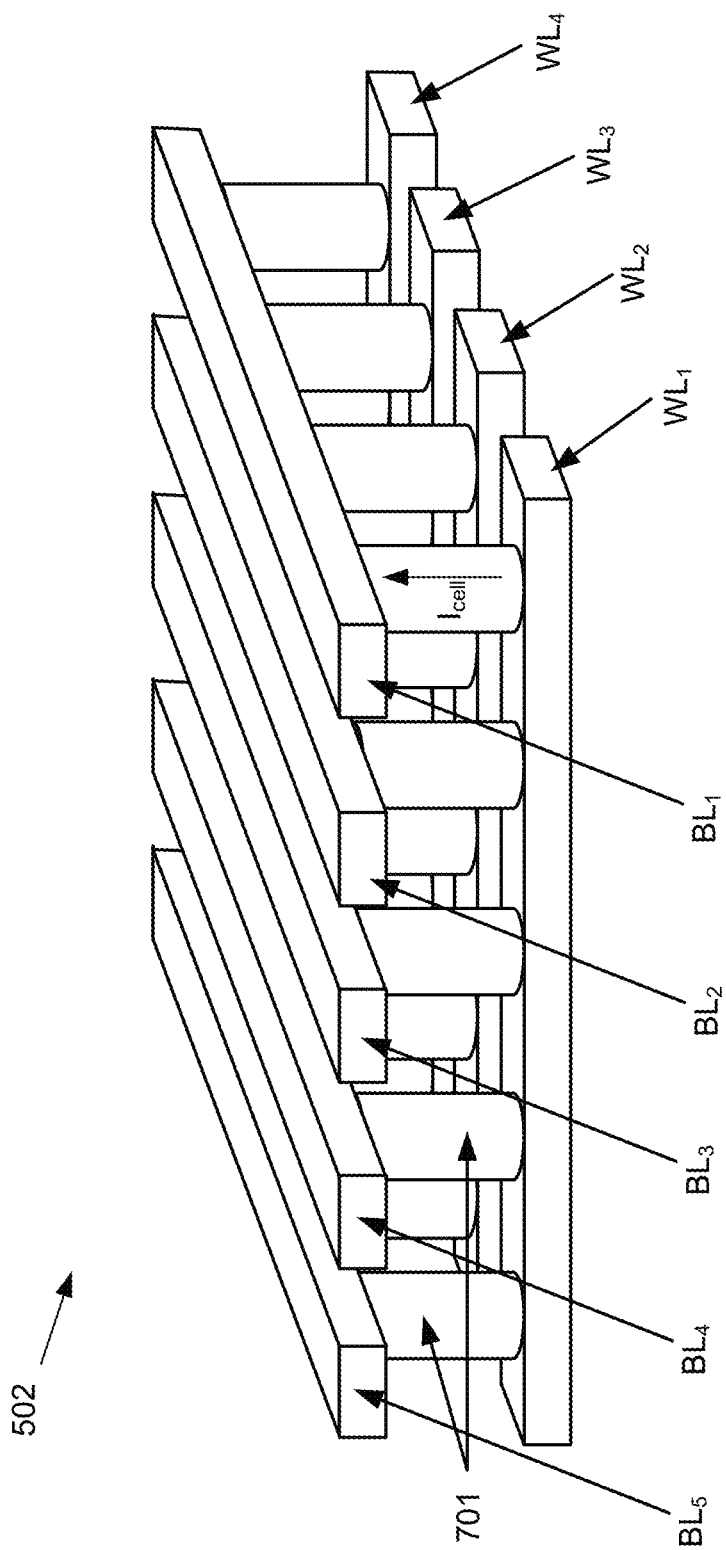
FIG. 7A depicts one embodiment of a portion of a memory array that forms a cross-point architecture in an oblique view.

FIG. 7A depicts one embodiment of a portion of a memory array that forms a cross-point architecture in an oblique view. Memory array 502 of FIG. 7A is one example of an implementation for memory array 502 in FIG. 5A or 5B, where a memory die 292 or memory structure die 580 can include multiple such array structures. The bit lines $BL_1$-$BL_5$ are arranged in a first direction (represented as running into the page) relative to an underlying substrate (not shown) of the die and the word lines $WL_1$-$WL_5$ are arranged in a second direction perpendicular to the first direction. FIG. 7A is an example of a horizontal cross-point structure in which word lines $WL_1$-$WL_5$ and $BL_1$-$BL_5$ both run in a horizontal direction relative to the substrate, while the memory cells, two of which are indicated at 701, are oriented so that the current through a memory cell (such as shown at $I_{cell}$) runs in the vertical direction. In a memory array with additional layers of memory cells, such as discussed below with respect to FIG. 7D, there would be corresponding additional layers of bit lines and word lines.

As depicted in FIG. 7A, memory array 502 includes a plurality of memory cells 701. The memory cells 701 may include re-writeable memory cells, such as can be implemented using ReRAM, MRAM, PCM, or other material with a programmable resistance. The following discussion will focus on MRAM memory cells, although much of the discussion can be applied more generally. The current in the memory cells of the first memory level is shown as flowing upward as indicated by arrow $I_{cell}$, but current can flow in either direction, as is discussed in more detail in the following.

Figure 7B:
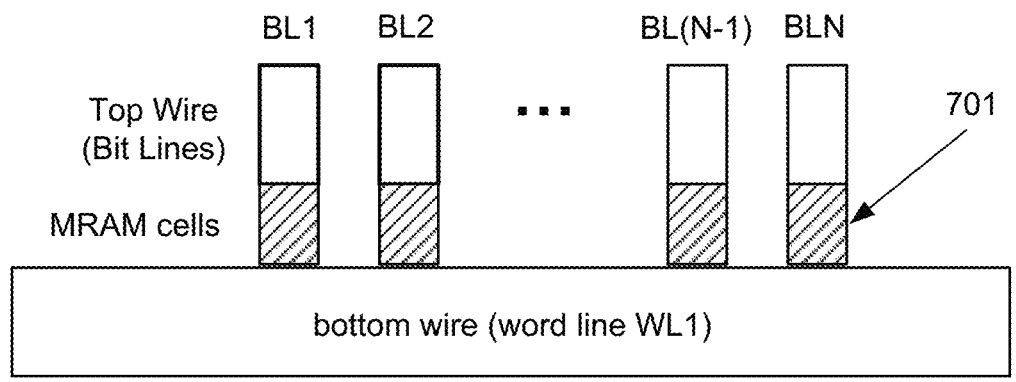
FIGS. 7B and 7C respectively present side and top views of the cross-point structure in FIG. 7A.
Figure 7C:
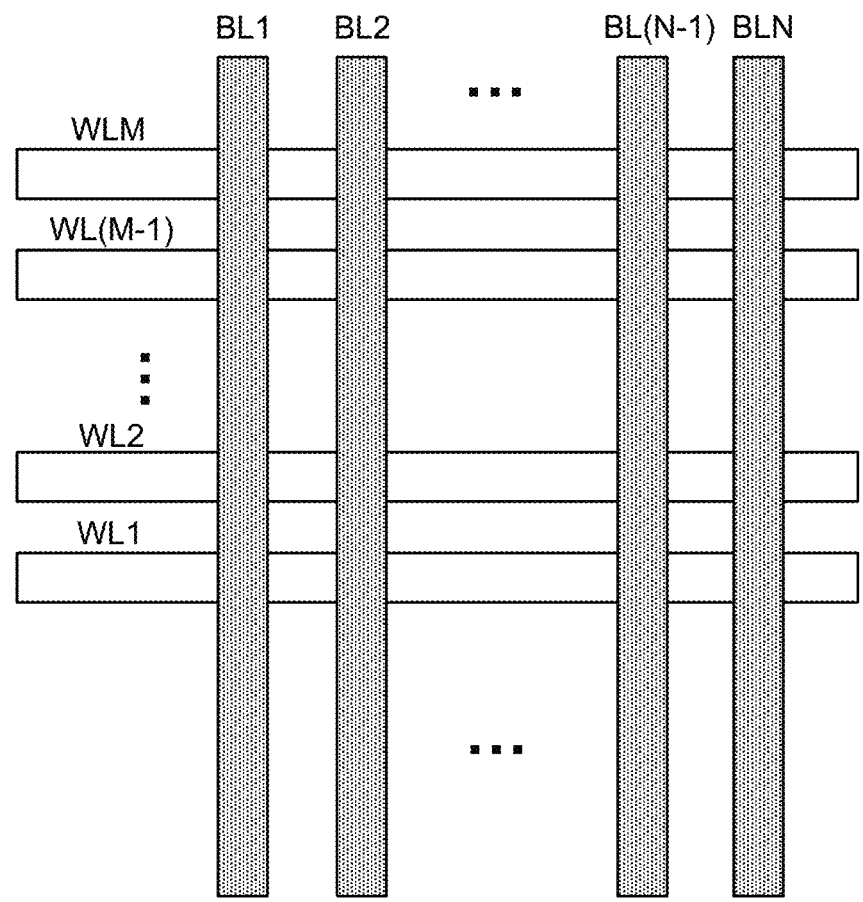

FIGS. 7B and 7C respectively present side and top views of the cross-point structure in FIG. 7A. The sideview of FIG. 7B shows one bottom wire, or word line, $WL_1$ and the top wires, or bit lines, $BL_1$-$BL_n$. At the cross-point between each top wire and bottom wire is an MRAM memory cell 701, although PCM, ReRAM, FeRAM, or other technologies can be used. FIG. 7C is a top view illustrating the cross-point structure for M bottom wires $WL_1$-$WL_M$ and N top wires $BL_1$-$BL_N$. In a binary embodiment, the MRAM cell at each cross-point can be programmed into one of two resistance states: high and low. More detail on embodiments for an MRAM memory cell design and techniques for their programming are given below. In some embodiments, sets of these wires are arrayed continuously as a "tile", and such tiles may be paired adjacently in the Word Line (WL) direction and in the Bit Line direction to create a module. Such a module may be composed of 2×2 tiles to form a four tile combination wherein the WL drivers between the tiles is "center driven" between the tiles with the WL running continuously over the driver at center of the line. Similarly BL drivers may be located between the pair of tiles paired in the BL direction to be center driven, whereby the driver area is shared between a pair of tiles.

The cross-point array of FIG. 7A illustrates an embodiment with one layer of word lines and bits lines, with the MRAM or other memory cells sited at the intersection of the two sets of conducting lines. To increase the storage density of a memory die, multiple layers of such memory cells and conductive lines can be formed. A 2-layer example is illustrated in FIG. 7D.

Figure 7D:
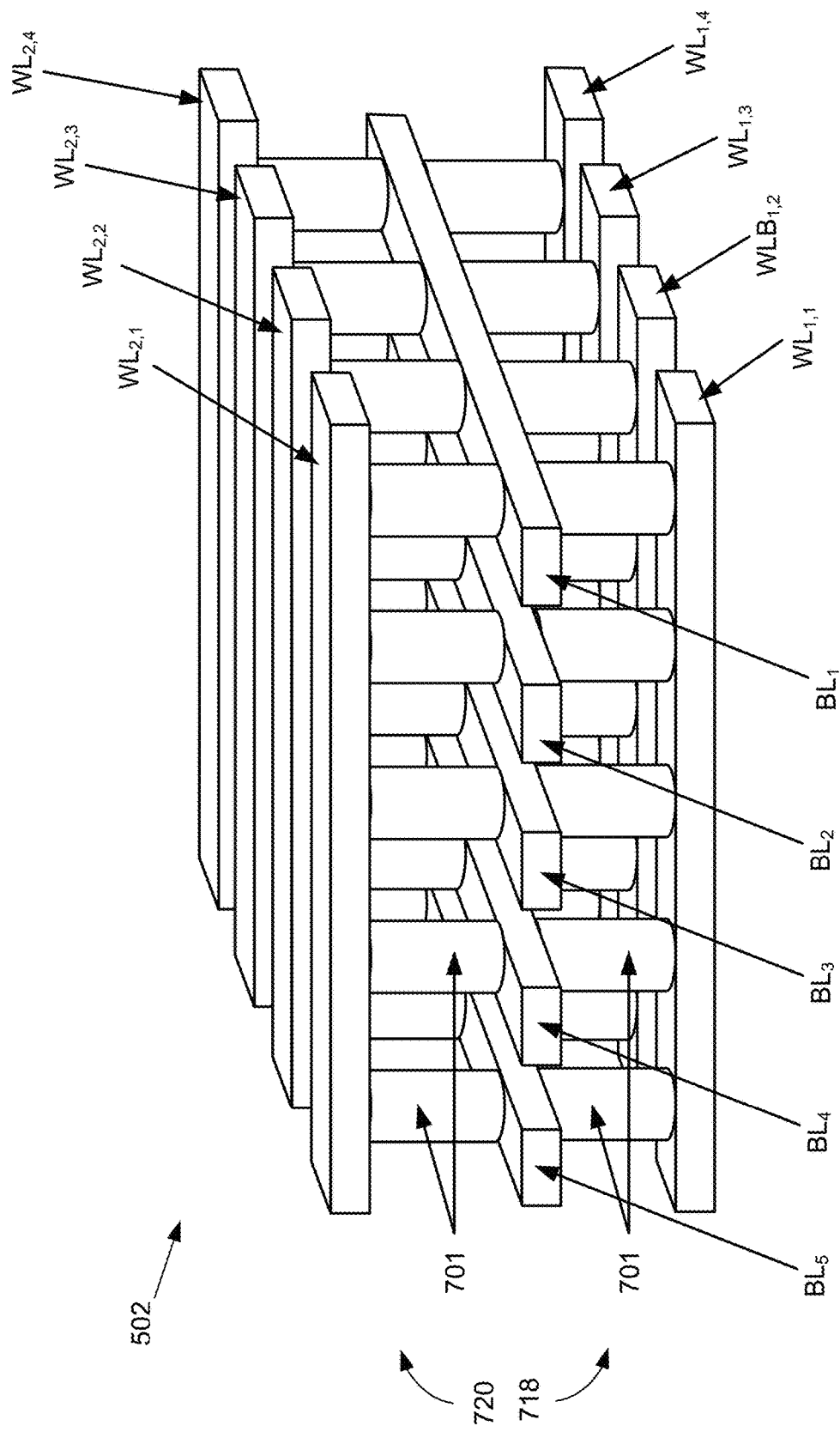
FIG. 7D depicts an embodiment of a portion of a two level memory array that forms a cross-point architecture in an oblique view.

FIG. 7D depicts an embodiment of a portion of a two level memory array that forms a cross-point architecture in an oblique view. As in FIG. 7A, FIG. 7D shows a first layer 718 of memory cells 701 of an array 502 connected at the cross-points of the first layer of word lines $WL_{1,1}$-$WL_{1,4}$ and bit lines $BL_1$-$BL_5$. A second layer of memory cells 720 is formed above the bit lines $BL_1$-$BL_5$ and between these bit lines and a second set of word lines $WL_{2,1}$-$WL_{2,4}$. Although FIG. 7D shows two layers, 718 and 720, of memory cells, the structure can be extended upward through additional alternating layers of word lines and bit lines. Depending on the embodiment, the word lines and bit lines of the array of FIG. 7D can be biased for read or program operations such that current in each layer flows from the word line layer to the bit line layer or the other way around. The two layers can be structured to have current flow in the same direction in each layer for a given operation or to have current flow in the opposite directions by driver selection in the positive or negative direction.

The use of a cross-point architecture allows for arrays with a small footprint and several such arrays can be formed on a single die. The memory cells formed at each cross-point can be a resistive type of memory cell, where data values are encoded as different resistance levels. Depending on the embodiment, the memory cells can be binary valued, having either a low resistance state or a high resistance state, or multi-level cells (MLCs) that can have additional resistance intermediate to the low resistance state and high resistance state. The cross-point arrays described here can be used in the memory die 292 of FIG. 4, the local memory 106 in FIG. 1, and/or the host memory 124 in FIG. 1. Resistive type memory cells can be formed according to many of the technologies mentioned above, such as ReRAM, PCM, FeRAM, or MRAM. The following discussion is presented mainly in the context of memory arrays using a cross-point architecture with binary valued MRAM memory cells, although much of the discussion is more generally applicable.

Figure 8:
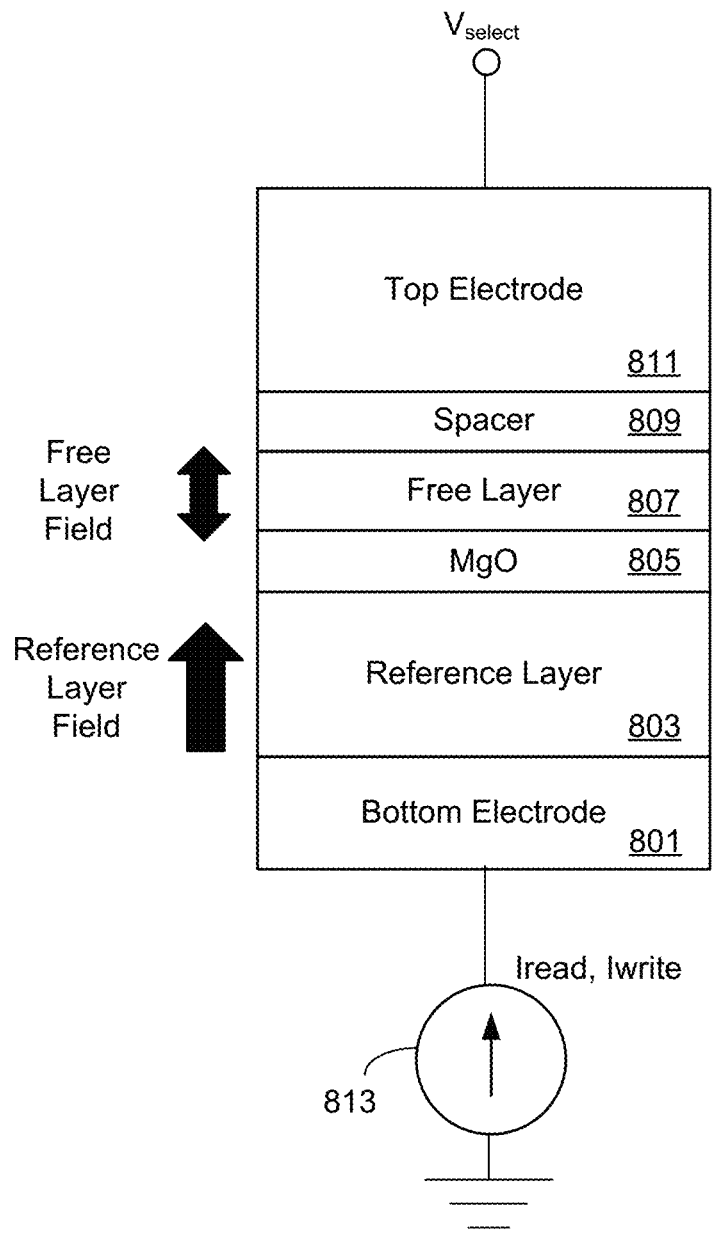
FIG. 8 illustrates an embodiment for the structure of an MRAM memory cell.

FIG. 8 illustrates an embodiment for the structure of an MRAM cell. The MRAM cell includes a bottom electrode 801, a pair of magnetic layers (reference layer 803 and free layer 807) separated by a separation or tunneling layer of, in this example, magnesium oxide (MgO) 805, and then a top electrode 811 separated from the free layer 807 by a spacer 809. In some embodiments, the bottom electrode 801 is referred to as a word line and the top electrode 811 is referred to as a bit line. The state of the memory cell is based on the relative orientation of the magnetizations of the reference layer 803 and the free layer 807: if the two layers are magnetized in the same direction, the memory cell will be in a parallel (P) low resistance state (LRS); and if they have the opposite orientation, the memory cell will be in an anti-parallel (AP) high resistance state (HRS). An MLC embodiment would include additional intermediate states. The orientation of the reference layer 803 is fixed and, in the example of FIG. 8, is oriented upward. Reference layer 803 is also known as a fixed layer or pinned layer.

Data is written to an MRAM memory cell by programming the free layer 807 to either have the same orientation or opposite orientation. An array of MRAM memory cells may be placed in an initial, or erased, state by setting all of the MRAM memory cells to be in the low resistance state in which all of their free layers have a magnetic field orientation that is the same as the their reference layers. Each of the memory cells is then selectively programmed (also referred to as "written") by placing its free layer 807 to be in the high resistance state by reversing the magnetic field to be opposite that of the reference layer 803. The reference layer 803 is formed so that it will maintain its orientation when programming the free layer 807. The reference layer 803 can have a more complicated design that includes synthetic anti-ferromagnetic layers and additional reference layers. For simplicity, the figures and discussion omit these additional layers and focus only on the fixed magnetic layer primarily responsible for tunneling magnetoresistance in the cell.

In the embodiment of FIG. 8, a forced current approach is used to access the MRAM cell. The forced current approach may be used to read or write the MRAM cell. In the forced current approach, an access current (e.g., $I_{read}$ $I_{write}$) is driven through the bottom electrode 801 by a current source 813. The current source 813 is a part of the driver circuitry for the bottom electrode 801. A voltage (e.g., $V_{select}$) is provided to the top electrode 811. Herein, the terms "read current" ($I_{read}$) and "write current" ($I_{write}$) will be used in connection with access currents that are driven through MRAM cells. A write current is a current that is driven through a first conductive line (e.g., word line) that, in combination with a voltage applied to a second conductive line (e.g., bit line), will change the state of the MRAM cell. As an example, a write current of about 30 uA may be used for an MRAM cell with a Critical Dimension (CD) of approximately 20 nanometers with RA10. Read currents may be about half the write current if applied for a limited time, such as <30 ns. A write current that flows in one direction through the MRAM cell will change an AP-state MRAM cell from the AP-state to the P-state. A write current that flows in the other direction through the MRAM cell will change a P-state MRAM cell from the P-state to the AP-state. In general, a read current will preferably be set low enough so as not to change the state of an MRAM cell from the P-state to the AP-state or from the AP-state to the P-state.

As defined herein, the access current may have a positive magnitude (or direction) or a negative magnitude. A positive magnitude access current that is driven through a first conductive line (e.g., word line) at a given point will flow in the opposite direction as a negative magnitude access current that is driven through the first conductive line at the given point. Hence, the access current may flow through the MRAM cell in either direction, depending on the whether the access current is defined as having has a positive or negative magnitude. FIG. 8 depicts the current flowing in a positive direction, but the current could flow in the opposite (negative) direction.

As discussed more fully below in connection with FIG. 10A, in some embodiments, a read current may be applied in an AP2P direction or, alternatively, in a P2AP direction. In some embodiments, the MRAM cell is read by performing an SRR. In one embodiment, an SRR has a first read (Read1 in the AP2P direction), a write to the P-state, and a second read (Read2 in the AP2P direction). The voltage level of the memory cell due to Read1 in the AP2P direction is recorded. The voltage level due to Read2 in the AP2P direction is compared with the voltage level due to Read1 in the AP2P direction. A change in the voltage level indicates that the MRAM cell was originally in the AP-state. Alternatively, the SRR has a first read (Read1 in the P2AP direction), a write to the AP-state, and a second read (Read2 in the P2AP direction). The voltage level of the memory cell due to Read1 in the P2AP direction is recorded. The voltage level due to Read2 in the P2AP direction is compared with the voltage level due to Read1 in the P2AP direction. A change in the voltage level indicates that the MRAM cell was originally in the P-state.

In one embodiment, the MRAM cell is read by applying, for example, 0V to the top electrode 811, while driving a current of, for example, 15 micro Amperes (μA) through the bottom electrode 801. This read current will flow from the bottom electrode 801 to the top electrode 811. Note that the read may be Read1 or Read2 in the P2AP direction. In some embodiments, data is written to the MRAM cell using a bipolar write operation. In one embodiment, the MRAM cell is written from the AP-state to the P-state by applying, for example, 3V to the top electrode 811, while driving a write current of, for example, −30 μA through the bottom electrode 801. This write current will flow from the top electrode 811 to the bottom electrode 801. In one embodiment, the MRAM cell is written from the P-state to the AP-state by applying, for example, 0V to the top electrode 811, while driving a current of, for example, 30 μA through the bottom electrode 801. This write current will flow from the bottom electrode 801 to the top electrode 811.

As an alternative to the approach in FIG. 8, the select voltage can be applied to the bottom electrode 801, with the access current applied through the top electrode 811. In one such embodiment, the MRAM cell is read by applying, for example, 3V to the bottom electrode 801, while driving a read current of, for example, −15 μA through the top electrode 811. This read current will flow from the bottom electrode 801 to the top electrode 811.

In one embodiment, the MRAM cell is written from the AP-state to the P-state by applying, for example, −3V to the bottom electrode 801, while driving a write current of, for example, 30 μA through the top electrode 811. This write current will flow from the bottom electrode 801 to the top electrode 811. In one embodiment, the MRAM cell is written from the P-state to the AP-state by applying, for example, 0V to the bottom electrode 801, while driving a current of, for example, −30 μA through the top electrode 811. This write current will flow from the top electrode 811 to the bottom electrode 801.

Figure 9:
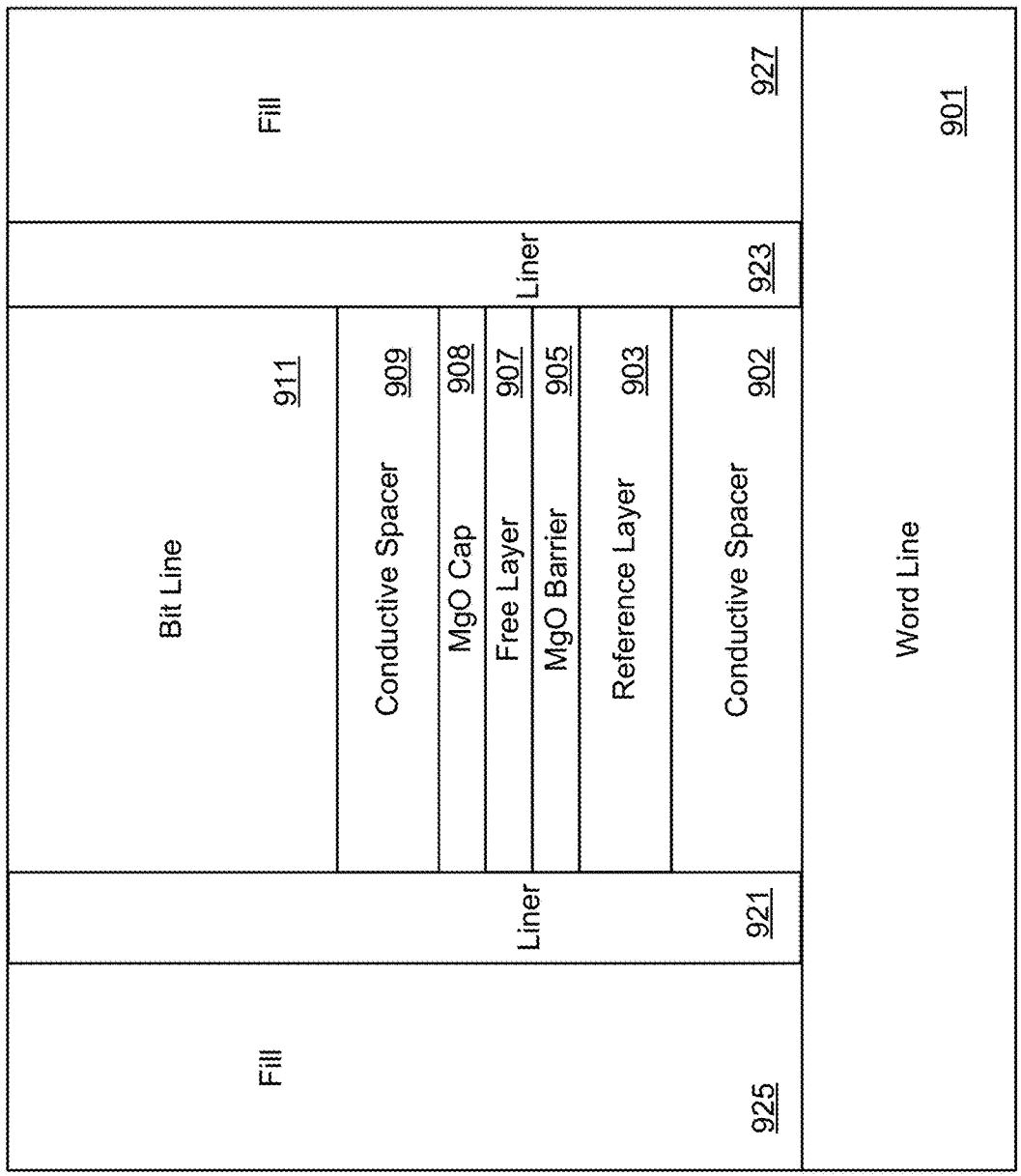
FIG. 9 illustrates an embodiment for an MRAM memory cell design as it would be implemented in a cross-point array in more detail.

FIG. 9 illustrates an embodiment for an MRAM memory cell design as it may be implemented in a cross-point array in more detail. When placed in a cross-point array, the top and bottom electrodes of the MRAM memory cells will be the top and bottom wires of the array. In the embodiment shown here, the bottom electrode is the word line 901 and the top electrode is the bit line 911 of the memory cell, but these can be reversed in some embodiments. Between the word line 901 and bit line 911 are the reference layer 903 and free layer 907, which are again separated MgO barrier 905. In the embodiment shown in FIG. 9, an MgO cap 908 is also formed on top of the free layer 907 and a conductive spacer 909 is formed between the bit line 911 and the MgO cap 908. The reference layer 903 is separated from the word line 901 by another conductive spacer 902. On either side of the memory cell structure is a liner 921 and 923, where these can be part of the same structure, but appear separate in the cross-section of FIG. 9. To either side of the liner 921, 923 is shown some of fill material 925, 927 used to fill in the otherwise empty regions of the cross-point structure.

With respect to the free layer design 907, embodiments include CoFe or CoFeB Alloy with a thickness on the order ~1-2 nm, where an Ir layer can be interspersed in the free layer close to MgO barrier 905 and the free layer 907 can be doped with Ta, W, or Mo. Embodiments for the reference layer 903 can include a bilayer of CoFeB and CoPt multi-layer coupled with an Ir or Ru spacer 902. The MgO cap 908 is optional, but can be used to increase anisotropy of free layer 907. The conductive spacers can be conductive metals such as Ta, W, Ru, CN, TiN, and TaN, among others.

The following discussion will mainly be discussed with respect to a perpendicular spin transfer torque MRAM memory cell, where the free layer 807/907 of FIGS. 8 and 9 comprises a switchable direction of magnetization that is perpendicular to the plane of the free layer. Spin transfer torque ("STT") is an effect in which the orientation of a magnetic layer in a magnetic tunnel junction can be modified using a spin-polarized current. Charge carriers (such as electrons) have a property known as spin which is a small quantity of angular momentum intrinsic to the carrier. An electric current is generally unpolarized (e.g., consisting of 50% spin-up and 50% spin-down electrons). A spin polarized current is one with more electrons of either spin (e.g., a majority of spin-up electrons or a majority of spin-down electrons). By passing a current through a thick magnetic layer (the reference layer), a spin-polarized current can be produced. If this spin-polarized current is directed into a second magnetic layer (the free layer), angular momentum can be transferred to this second magnetic layer, changing the direction of magnetization of the second magnetic layer. This is referred to as spin transfer torque. FIGS. 10A and 10B illustrate the used of spin transfer torque to program or write to MRAM memory. Spin transfer torque magnetic random access memory (STT MRAM) has the advantages of lower power consumption and better scalability over other MRAM variations. Compared to other MRAM implementations, such as toggle MRAM, the STT switching technique requires relatively low power, virtually eliminates the problem of adjacent bit disturbs, and has more favorable scaling for higher memory cell densities (reduced MRAM cell size). The latter issue also favors STT MRAM where the free and reference layer magnetizations are orientated perpendicular to the film plane, rather than in-plane.

As the STT phenomenon is more easily described in terms electron behavior, FIGS. 10A and 10B and their discussion is given in terms of electron current, where the direction of the write current is defined as the direction of the electron flow. Therefore, the term write current in reference to FIGS. 10A and 10B refers to an electron current. As electrons are negatively charged, the electron current will be in the opposite direction from the conventionally defined current, so that an electron current will flow from a lower voltage level towards a higher voltage level instead the conventional current flow of from a higher voltage level to a lower voltage level.

FIGS. 10A and 10B illustrate the writing of an MRAM memory cell by use the STT mechanism, depicting a simplified schematic representation of an example of an STT-switching MRAM memory cell 1000 in which both the reference and free layer magnetization are in a perpendicular direction. Memory cell 1000 includes a magnetic tunnel junction (MTJ) 1002 comprising an upper ferromagnetic layer 1010, a lower ferromagnetic layer 1012, and a tunnel barrier (TB) 1014 as an insulating layer between the two ferromagnetic layers. In this example, upper ferromagnetic layer 1010 is the free layer FL and the direction of its magnetization can be switched. Lower ferromagnetic layer 1012 is the reference (or fixed) layer RI, and the direction of its magnetization cannot be switched. When the magnetization in free layer 1010 is parallel to the magnetization in reference layer RL 1012, the resistance across the memory cell 1000 is relatively low. When the magnetization in free layer FL 1010 is anti-parallel to the magnetization in reference layer RL 1012, the resistance across memory cell 1000 is relatively high. The data ("0" or "1") in memory cell 1000 is read by measuring the resistance of the memory cell 1000. In this regard, electrical conductors 1006/1008 attached to memory cell 1000 are utilized to read the MRAM data. By design, both the parallel and antiparallel configurations remain stable in the quiescent state and/or during a read operation (at sufficiently low read current).

For both the reference layer RL 1012 and free layer FL 1010, the direction of magnetization is in the perpendicular direction (i.e. perpendicular to the plane defined by the free layer and perpendicular to the plane defined by the reference layer). FIGS. 10A and 10B show the direction of magnetization of reference layer RL 1012 as up and the direction of magnetization of free layer FL 1010 as switchable between up and down, which is perpendicular to the plane.

In one embodiment, tunnel barrier 1014 is made of Magnesium Oxide (MgO); however, other materials can also be used. Free layer 1010 is a ferromagnetic metal that possess the ability to change/switch its direction of magnetization. Multilayers based on transition metals like Co, Fe and their alloys can be used to form free layer 1010. In one embodiment, free layer 1010 comprises an alloy of Cobalt, Iron and Boron. Reference layer 1012 can be many different types of materials including (but not limited to) multiple layers of Cobalt and Platinum and/or an alloy of Cobalt and Iron.

To "set" the MRAM memory cell bit value (i.e., choose the direction of the free layer magnetization), an electron write current 1050 is applied from conductor 1008 to conductor 1006, as depicted in FIG. 10A. To generate the electron write current 1050, the top conductor 1006 is placed at a higher voltage level than bottom conductor 1008, due the negative charge of the electron. The electrons in the electron write current 1050 become spin-polarized as they pass through reference layer 1012 because reference layer 1012 is a ferromagnetic metal. When the spin-polarized electrons tunnel across the tunnel barrier 1014, conservation of angular momentum can result in the imparting of a spin transfer torque on both free layer 1010 and reference layer 1012, but this torque is inadequate (by design) to affect the magnetization direction of the reference layer 1012. Contrastingly, this spin transfer torque is (by design) sufficient to switch the magnetization orientation in the free layer 1010 to become parallel (P) to that of the reference layer 1012 if the initial magnetization orientation of the free layer 1010 was anti-parallel (AP) to the reference layer 1012, referred to as an anti-parallel-to-parallel (AP2P) write. The parallel magnetizations will then remain stable before and after such electron write current is turned off.

In contrast, if free layer 1010 and reference layer 1012 magnetizations are initially parallel, the direction of magnetization of free layer 1010 can be switched to become antiparallel to the reference layer 1012 by application of an electron write current of opposite direction to the aforementioned case. For example, electron write current 1052 is applied from conductor 1006 to conductor 1008, as depicted in FIG. 10B, by placing the higher voltage level on the lower conductor 1008. This will write a free layer 1010 in a P state to an AP state, referred to as a parallel-to-anti-parallel (P2AP) write. Thus, by way of the same STT physics, the direction of the magnetization of free layer 1010 can be deterministically set into either of two stable orientations by judicious choice of the electron write current direction (polarity).

The data ("0" or "1") in memory cell 1000 can read by measuring the resistance of the memory cell 1000. Low resistance typically represents a "0" bit and high resistance typically represents a "1" bit, although sometimes the alternate convention occurs. A read current can being applied across the memory cell (e.g., across the magnetic tunnel junction 1002) by applying an electron read current from conductor 1008 to conductor 1006, flowing as shown for 1050 in FIG. 10A (the "AP2P direction"); alternatively, the electron read current can be applied from conductor 1006 to conductor 1008, flowing as shown for 1052 in FIG. 10B (the "P2AP direction"). In a read operation, if the electron current is too high, this can disturb data stored in a memory cell and change its state. For example, if electron read current uses the P2AP direction of FIG. 10B, too high of a current or voltage level can switch any memory cells in the low resistance P state into the high resistance AP state. Consequently, although the MRAM memory cell can be read in either direction, the directional nature of the write operation may make one read direction preferable over the other in various embodiments.

Although the discussion of FIGS. 10A and 10B was in the context of electron current for the read and write currents, the subsequent discussion will be in the context of conventional current unless otherwise specified.

Whether to read or write selected memory cells in the array structures of FIGS. 7A-7D, the bit line and word line corresponding a selected memory cell is biased to place a voltage across the selected memory cell and induce the flow of electrons as illustrated with respect to FIG. 10A or 10B. Note that in some embodiments, the word line is biased by driven a current through the word line. This will also apply a voltage across non-selected memory cells of the array, which can induce currents in non-selected memory cells. Although this wasted power consumption can be mitigated to some degree by designing the memory cells to have relatively high resistance levels for both high and low resistance states, this will still result in increased current and power consumption as well as placing additional design constraints on the design of the memory cells and the array. Note that herein, a "selected memory cell" means that the memory cell is selected for access (e.g., read access, write access). An "unselected memory cell" means that the memory cell is not selected for access. A given process may result in write currents that are about the same for forward versus reverse write of the MRAM, or it may be that writing from low resistance state (LRS) to high resistance state (HRS) requires about 20% more current for CD of approximately 20 nm and RA10.

One approach to address this unwanted current leakage is to place a selector element in series with each MRAM or other resistive (e.g., ReRAM, PCM) memory cell. For example, a select transistor can be placed in series with each resistive memory cell element in FIGS. 7A-7D so that the memory cells 701 is now a composite of a select transistor and a programmable resistance. Use of a select transistor, however, requires the introduction of additional control lines to be able to turn on the corresponding transistor of a selected memory cell. Additionally, transistors will often not scale in the same manner as the resistive memory element, so that as memory arrays move to smaller sizes the use of transistor based selectors can be a limiting factor.

An alternate approach to select transistors is the use of a threshold switching selector in series with the programmable resistive element. A threshold switching selector has a high resistance (in an off or non-conductive state) when it is biased to a voltage lower than its threshold voltage, and a low resistance (in an on or conductive state) when it is biased to a voltage higher than its threshold voltage. The threshold switching selector remains on until its current is lowered below a holding current, or the voltage is lowered below a holding voltage. When this occurs, the threshold switching selector returns to the off state. Accordingly, to program a memory cell at a cross-point, a voltage is applied which is sufficient to turn on the associated threshold switching selector and set or reset the memory cell; and to read a memory cell, the threshold switching selector similarly must be activated by being turned on before the resistance state of the memory cell can be determined. One set of examples for a threshold switching selector is an ovonic threshold switching material of an Ovonic Threshold Switch (OTS). Example threshold switching materials include Ge—Se, Ge—Se—N, Ge—Se—As, Ge—Se—Sb—N, Ge58Se42, GeTe$_6$, Si—Te, Zn—Te, C—Te, B—Te, Ge—As—Te—Si—N, Ge—As—Se—Te—Si and Ge—Se—As—Te, with atomic percentages ranging from a few percent to more than 90 percent for each element.

Figure 11A:
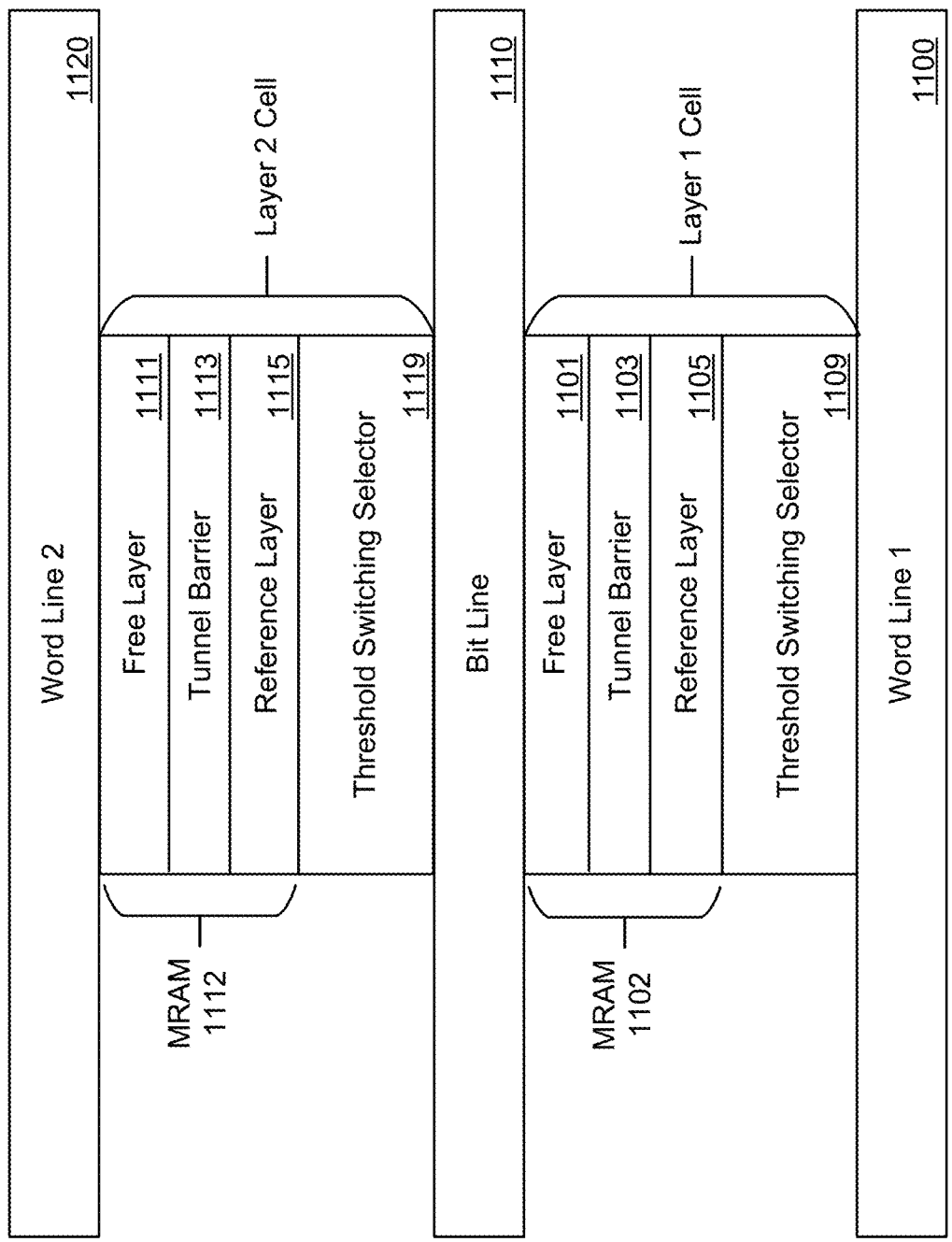
FIGS. 11A and 11B illustrate embodiments for the incorporation of threshold switching selectors into an MRAM memory array having a cross-point architecture.
Figure 11B:
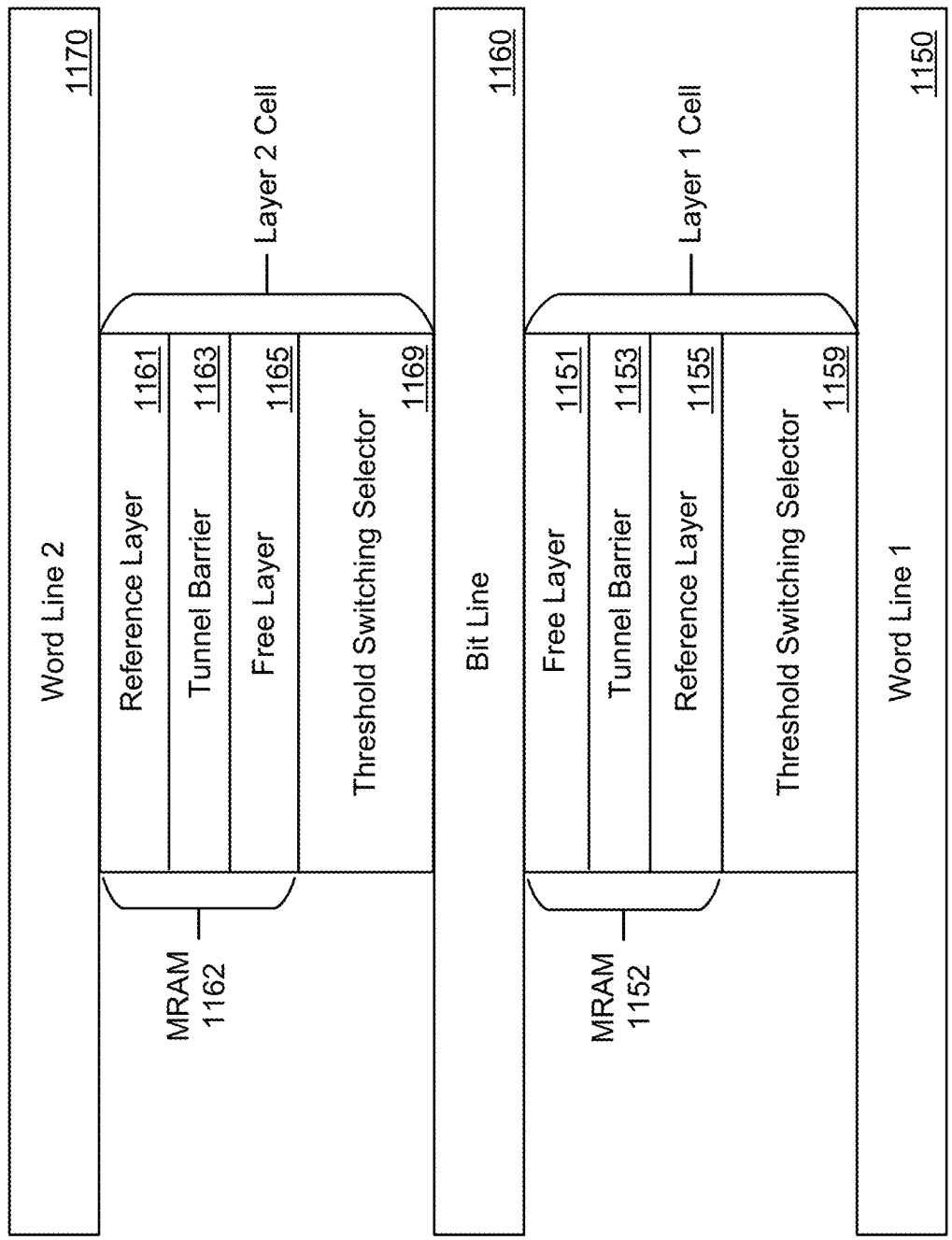

FIGS. 11A and 11B illustrate embodiments for the incorporation of threshold switching selectors into an MRAM memory array having a cross-point architecture. The examples of FIGS. 11A and 11B show two MRAM cells (Layer 1 Cell, Layer 2 Cell) in a two layer cross-point array, such as shown in FIG. 7D, but in a side view. FIGS. 11A and 11B show a lower first conducting line of word line 1 1100, an upper first conducting line of word line 2 1120, and an intermediate second conducting line of bit line 1110. In these figures, all of these lines are shown running left to right across the page for ease of presentation, but in a cross-point array they would be more accurately represented as represented in the oblique view of FIG. 7D where the word lines, or first conducting lines or wires, run in one direction parallel to the surface of the underlying substrate and the bit lines, or second conducting lines or wires, run in a second direction parallel to the surface to the substrate that is largely orthogonal to the first direction. The MRAM memory cells are also represented in a simplified form, showing only the reference layer, free layer, and the intermediate tunnel barrier, but in an actual implementation would typically include the additional structure described above with respect to FIG. 9.

An MRAM element 1102 including free layer 1101, tunnel barrier 1103, and reference layer 1105 is formed above the threshold switching selector 1109, where this series combination of the MRAM element 1102 and the threshold switching selector 1109 together form the layer 1 cell between the bit line 1110 and word line 1 1100. The series combination of the MRAM element 1102 and the threshold switching selector 1109 operate as largely as described above with respect to FIGS. 10A and 10B when the threshold switching selector 1109 is turned on, aside from some voltage drop across the threshold switching selector 1109. Initially, though, the threshold switching selector 1109 needs to be turned on by applying a voltage above the threshold voltage Vth of the threshold switching selector 1109, and then the biasing current or voltage needs to be maintained high enough above the holding current or holding voltage of the threshold switching selector 1109 so that it stays on during the subsequent read or write operation.

On the second layer, an MRAM element 1112 includes free layer 1111, tunnel barrier 1113, and reference layer 1115 is formed above the threshold switching selector 1119, with the series combination of the MRAM element 1112 and the threshold switching selector 1119 together forming the layer 2 cell between the bit line 1110 and word line 2 1120. The layer 2 cell will operate as for the layer 1 cell, although the lower conductor now corresponds to a bit line 1110 and the upper conductor is now a word line, word line 2 1120.

In the embodiment of FIG. 11A, the threshold switching selector 1109/1119 is formed below the MRAM element 1102/1112, but in alternate embodiments the threshold switching selector can be formed above the MRAM element for one or both layers. As discussed with respect to FIGS. 10A and 10B, the MRAM memory cell is directional. In FIG. 11A, the MRAM elements 1102 and 1112 have the same orientation, with the free layer 1101/1111 above (relative to the unshown substrate) the reference layer 1105/1115. Forming the layers between the conductive lines with the same structure can have a number of advantages, particularly with respect to processing as each of the two layers, as well as subsequent layers in embodiments with more layers, can be formed according to the same processing sequence.

FIG. 11B illustrates an alternate embodiment that is arranged similarly to that of FIG. 11A, except that in the layer 2 cell the locations of the reference layer and free layer are reversed. More specifically, between word line 1 1150 and bit line 1160, as in FIG. 11A the layer cell 1 includes an MRAM element 1 having a free layer 1151 formed over tunnel barrier 1153, that is turn formed over the reference layer 1155, with the MRAM element 1152 formed over the threshold switching selector 1159. The second layer of the embodiment of FIG. 11B again has an MRAM element 1162 formed over a threshold switching selector 1169 between the bit line 1160 and word line 2 1170, but, relative to FIG. 11A, with the MRAM element 1162 inverted, having the reference layer 1161 now formed above the tunnel barrier 1163 and the free layer 1165 now under the tunnel barrier 1163.

Although the embodiment of FIG. 11B requires a different processing sequence for the forming of layers, in some embodiments it can have advantages. In particular, the directionality of the MRAM structure can make the embodiment of FIG. 11B attractive since when writing or reading in the same direction (with respect to the reference and free layers) the bit line will be biased the same for both the lower layer and the upper layer, and both word lines will be biased the same. For example, if both layer 1 and layer 2 memory cells are sensed in the P2AP direction (with respect to the reference and free layers), the bit line layer 1160 will be biased such as in the P2AP direction, the bit line 1160 is biased low (e.g., 0V) for both the upper and lower cell, with word line 1 1150 and word line 2 1170 both biased to a higher voltage level. Similarly, with respect to writing, for writing to the high resistance AP state the bit line 1160 is biased low (e.g., 0V) for both the upper and lower cell, with word line 1 1150 and word line 2 1170 both biased to a higher voltage level; and for writing to the low resistance P state the bit line 1160 is biased to the high voltage level, with word line 1 1150 and word line 2 1170 both biased to the low voltage level. In contrast, for the embodiment of FIG. 11A, the bit lines and word lines would need to have their bias levels reversed for performing any of these operations on the upper level relative to the lower level. Note that in one embodiment of a forced current approach the word lines are biased to a target voltage by driving a current through the word line.

To either read data from or write data to an MRAM memory cell involves passing a current through the memory cell. In embodiments where a threshold switching selector is placed in series with the MRAM element, before the current can pass through the MRAM element the threshold switching selector needs to be turned on by applying a sufficient voltage across the series combination of the threshold switching selector and the MRAM element.

It can be quite difficult to concurrently access more than one bit in a cross-point memory array. Techniques are disclosed herein for concurrently accessing multiple memory cells in a cross-point array. In one embodiment, multiple memory cells in a cross-point array are read concurrently. In one embodiment, multiple memory cells in a cross-point array are written concurrently.

Figure 12:
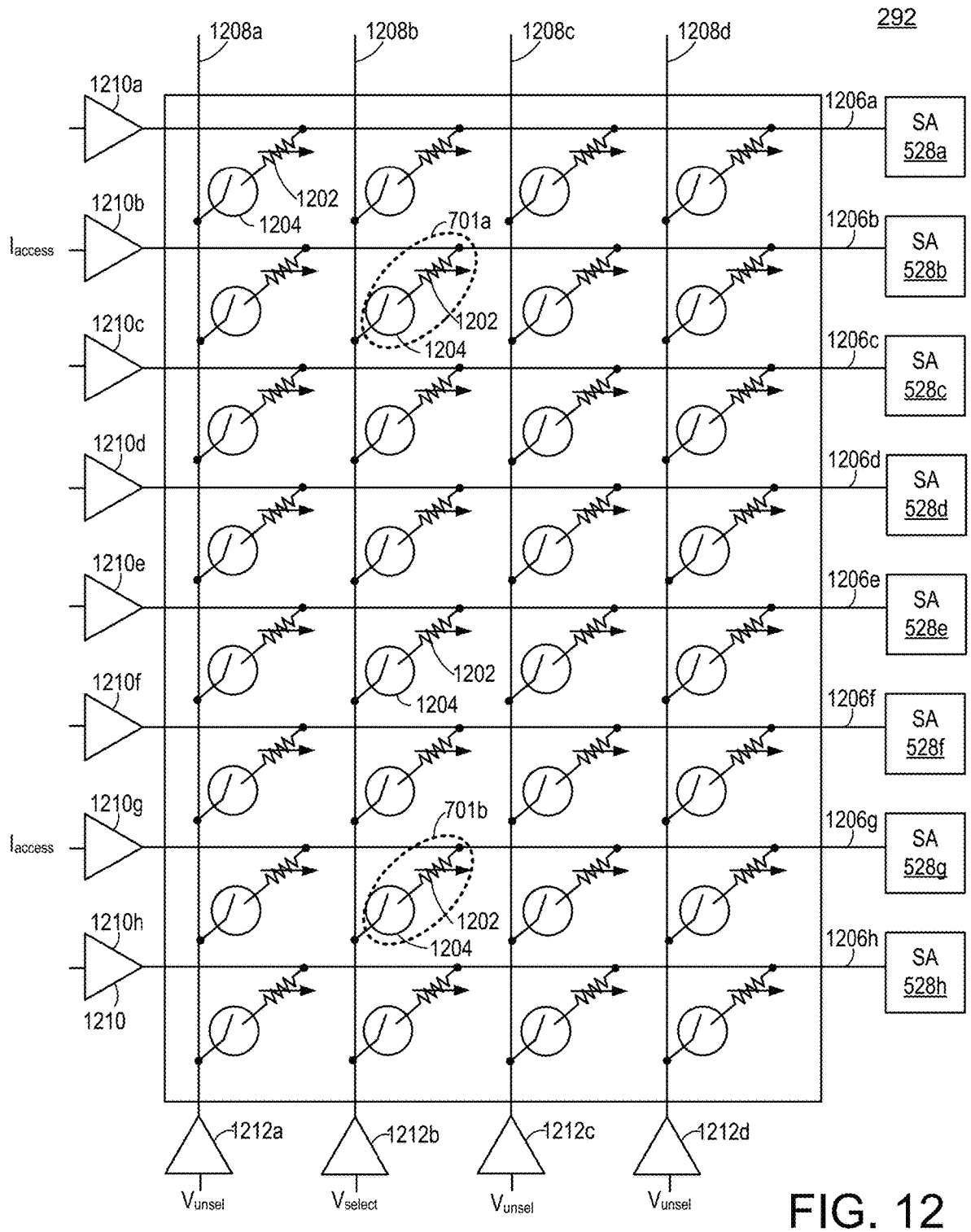
FIG. 12 depicts an embodiment of a memory array having a cross-point architecture, in which multiple memory cells are concurrently accessed.

FIG. 12 depicts an embodiment of a memory array 292 having a cross-point architecture, in which multiple memory cells are concurrently accessed. The array 292 has a set of first conductive lines 1206a-1206h and a set of second conductive lines 1208a-1208d. In one embodiment, the set of first conductive lines 1206a-1206h are word lines and the set of second conductive lines 1208a-1208b are bit lines. For ease of discussion, the set of first conductive lines 1206a-1206h may be referred to as word lines and the set of second conductive lines 1208a-1208b may be referred to as bit lines. However, the set of first conductive lines 1206a-1206h could be bit lines and the set of second conductive lines 1208a-1208b could be word lines.

The array 292 has a number of memory cells 701. Each memory cell 701 is connected between one of the first conductive lines 1206 and a corresponding one of the second conductive lines 1208. Each memory cell 701 has a magnetoresistive random access memory (MRAM) element 1202 in series with a threshold switching selector element 1204. Hence, each memory cell ("bit") 701 may be referred to as an MRAM cell or bit. The threshold switching selector 1204 is configured to become conductive in response to application of a voltage level exceeding a threshold voltage of the threshold switching selector 1204.

Each first conductive line 1206 is driven by one of the current drivers 1210a-1210h. For example, first conductive line 1206a is driven by current driver 1210a, first conductive line 1206b is driven by current driver 1210b, etc. Each second conductive line 1208 is driven by one of the voltage drivers 1212a-1212d. For example, first conductive line 1208a is driven by voltage driver 1212a, second conductive line 1208b is driven by voltage driver 1212b, etc. Current driver 1210b drives an access current ($I_{access}$) through selected word line 1206b. Likewise, current driver 1210g drives $I_{access}$ through selected word line 1206g. In some embodiments, the current drivers 1210 each comprise a transistor that is operated to be partially on and controlled by a current mirror to limit $I_{access}$ to a target current. The current drivers 1210 are configured to either source a current or sink a current. Thus, $I_{access}$ could flow in either direction through the selected word line. By convention used herein, when a current driver 1210 is used as a current source the magnitude of the access current is positive. By convention used herein, when a current driver 1210 is used as a current sink the magnitude of the access current is negative. Whether a current driver 1210 sources or sinks a current, herein this will be referred to as driving the current through the word line. In one embodiment, no current is driven through unselected word lines (e.g., 1206a, 1206c, 1206d, 1206e, 1206f, and 1206h). Note that herein, a "selected word line" means that the word line is connected to a selected memory cell. A selected word line may also be connected to unselected memory cells. An "unselected word line" means that the word line is connected to only unselected memory cells. In other words, all memory cells that connect to an unselected word line are unselected memory cells. Note that herein, a "selected bit line" means that the bit line is connected to at least one selected memory cell. An "unselected bit line" means that the bit line is connected to only unselected memory cells. In other words, all memory cells that connect to an unselected bit line are unselected memory cells. As noted above, a selected memory cell is a memory cell that is selected for access. A selected memory cell is connected between a selected word line and a selected bit line.

Two of the memory cells 701a, 701b are selected for concurrent access. Selected memory cell 701a is at the cross-point of selected word line 1206b and selected bit line 1208b. The other memory cells not selected for access (i.e., are unselected memory cells). Selected memory cell 701b is at the cross-point of selected word line 1206g and selected bit line 1208. All other word lines and all other bit lines are unselected. To select a memory cell 701, a select voltage ($V_{select}$) is provided to the selected bit line (e.g., bit line 1208b) and an access current is driven through a selected word line (e.g., word lines 1206b, 1206g). An unselect voltage ($V_{unsel}$) is provided to the unselected bit lines (e.g., bit lines 1208a, 1208c, 1208d). In one embodiment, $V_{select}$ has a magnitude such that the threshold switching selector 1204 in a selected memory cell will turn on. On the other hand, $V_{unsel}$ has a magnitude such that the threshold switching selector 1204 in an unselected memory cell will not turn on. It may be that the driver for the selected BL is located more towards the center of the BL shown, for example between WL 1206d and 1206e. In one embodiment, one selected WL is on one side of the BL driver (e.g., one or WLs 1206a-1206d) and the other selected WL is on the other side of the BL driver (e.g., one of WLs 1206e-1206h). Therefore, the IR drop (i.e., the voltage drop between two points along a conductor due to product of the current flowing through the conductor and the resistance between the two points along the conductor) along the selected BL may be reduced.

One of the sense amplifiers (SA) 528a-528h is connected to each word line. For example, SA 528a is connected to word line 1206a, SA 528b is connected to word line 1206b, etc. Each sense amplifier is configured to sense a voltage on the word line 1206 to which the SA is connected. In the alternative, a decoder selects the WL 1206 to be driven, and the current source and sense amplifier are connected to a global decoded line passing through the selection decode circuitry (not shown but apparent to one reasonably skilled).

In the example of FIG. 12 there are more word lines than bit lines in the cross-point array. In one embodiment, there are more bit lines than word lines in the cross-point array. In one embodiment, the number of bit lines equals the number of word lines in the cross-point array. In the example of FIG. 12 there are twice as many word lines as bit lines in the cross-point array; however, a different ratio could be used. Thereby, different tile sizes may be realized. For example, a tile may have 1024 BL by 2048 WL, which may be composed into a module of 2048×4096 cells by center driving the WL and BL between the four tiles. In this example, each module accesses two bits per Activate.

Figure 13:
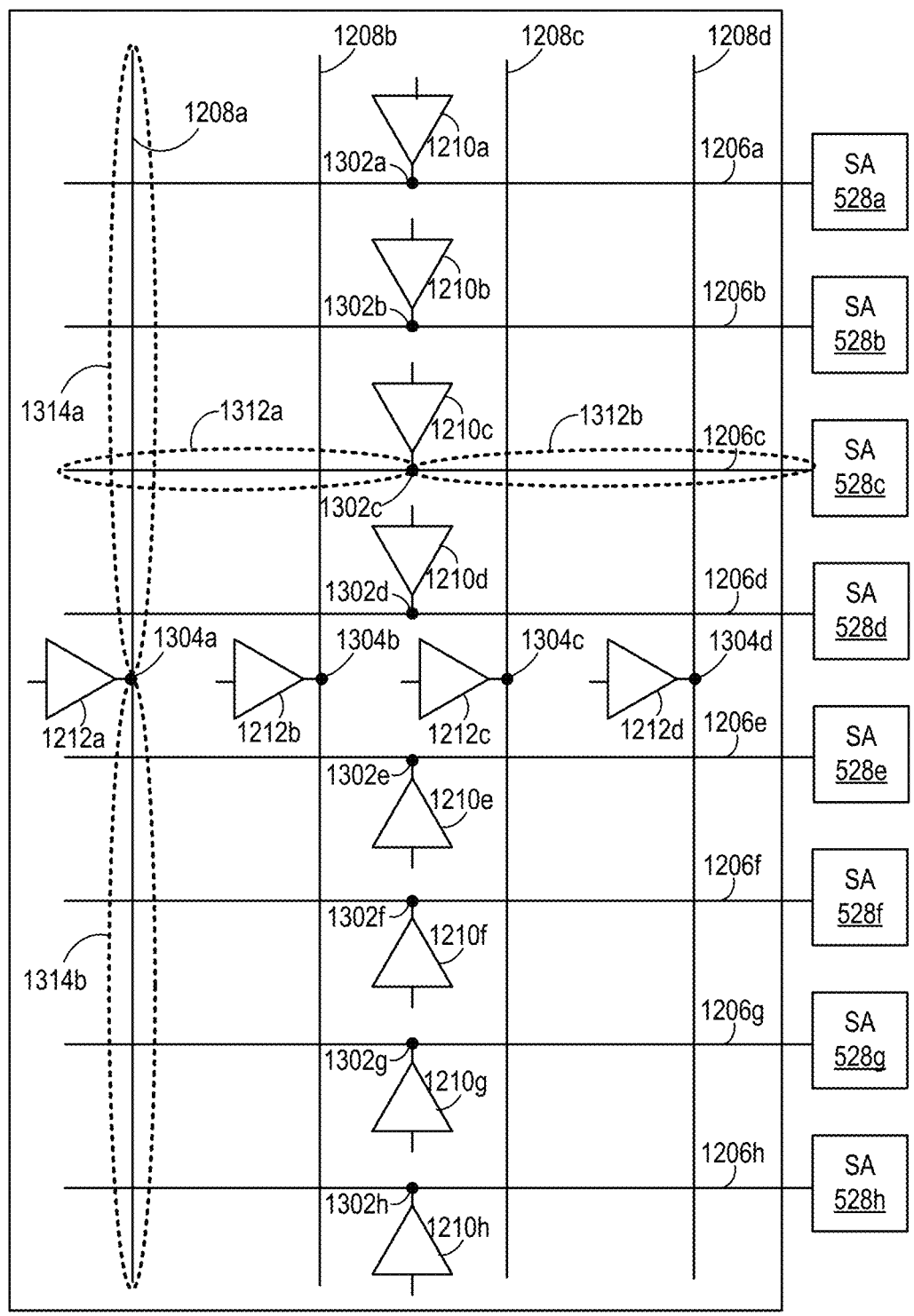
FIG. 13 depicts an embodiment of a memory array having a cross-point architecture, showing locations of contacts from drivers to bit lines and word lines.

In some embodiments, the voltage drivers 1212 connect to the respective bit lines 1208 at strategic locations. In some embodiments, the current drivers 1210 connect to the respective word lines 1206 at strategic locations. FIG. 13 depicts an embodiment of a memory array 292 having a cross-point architecture, showing locations of contacts from drivers to bit lines and word lines. The memory array 292 in FIG. 13 depicts the same word lines 1206a-1206h and bit lines 1208a-1208d, as the array in FIG. 12. However, the memory cells 701 are not depicted in FIG. 13.

Each current driver 1210a-1210h is connected to one of the word lines 1206 by a corresponding one of the word line contacts 1302a-1302h. In one embodiment, a current driver connects to its corresponding word line by way of a via. Thus, the current driver could reside at a different level of the cross-point array than the word line it drives. The current drivers 1210 could be located outside of the cross-point array, such as on control die 590. Each word line contact 1302 connects to a word line 1206 at a location that divides the respective word line 1206 into a first portion and a second portion. For example, word line contact 1302c connects to word line 1206c at a location that divides word line 1206c into a first portion 1312a and a second portion 1312b. In some embodiments, half of the bit lines 1208 are located such that they cross the word lines 1206 somewhere in the respective first portions and the other half of the bit lines are located such that they cross the word lines somewhere in the respective second portions. For example, bit lines 1208a and 1208b cross the first portion 1312a of word line 1206c, whereas bit lines 1208c and 1208d cross the second portion 1312b of word line 1206c. In some embodiments, the word line contacts 1302 at located at the approximate midpoint of the respective word lines 1206. Thus, in some embodiments, the first and second portions of the respective word lines are about the same length.

Each voltage driver 1212a-1212h is connected to one of the bit lines 1208 by a corresponding one of the bit line contacts 1304a-1304h. In one embodiment, a voltage driver connects to its corresponding bit line by way of a via. Thus, the voltage driver could reside at a different level of the cross-point array than the bit line it drives. The voltage drivers 1212 could be located outside of the cross-point array, such as on control die 590. Each bit line contact 1304 connects to a bit line 1208 at a location that divides the respective bit line 1208 into a first portion and a second portion. For example, bit line contact 1304a connects to bit line 1208a at a location that divides bit line 1208a into a first portion 1314a and a second portion 1314b. In some embodiments, half of the word lines 1206 are located such that they cross the bit lines somewhere in the respective first portions and the other half of the word lines 1206 are located such that they cross the bit lines somewhere in the respective second portions. For example, word lines 1206a-1206d cross the first portion 1314a of bit line 1208a whereas word lines 1206e-1206h cross the second portion 1314b of bit line 1208a. In some embodiments, the bit line contacts 1304 at located at a midpoint of the respective bit lines 1208. Thus, in some embodiments, the first and second portions of the respective bit lines 1208 are about the same length.

Figure 14:
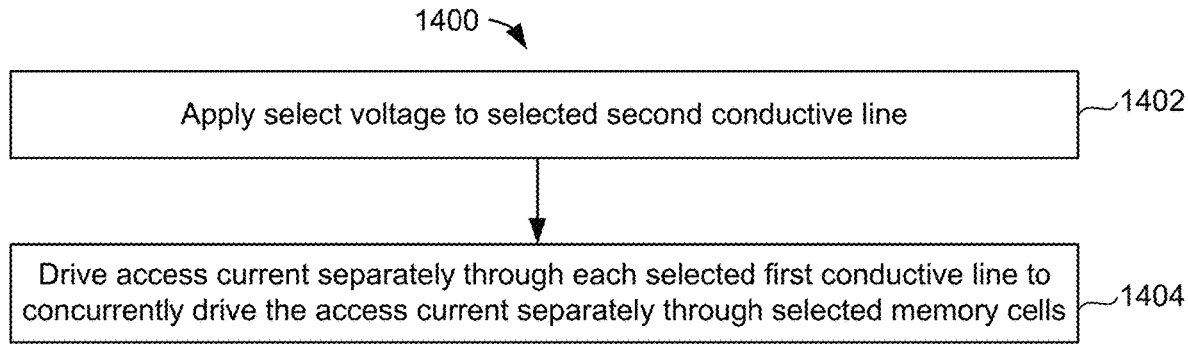
FIG. 14 is a flowchart of one embodiment of a process of concurrently accessing multiple memory cells in a cross-point array.

FIG. 14 is a flowchart of one embodiment of a process 1400 of concurrently accessing multiple memory cells in a cross-point array. In an embodiment, the memory cells are MRAM cells. In one embodiment, the process 1400 is performed to concurrently read multiple memory cells in a cross-point array. In one embodiment, the process 1400 is performed to concurrently write multiple memory cells in a cross-point array. In one embodiment, the process 1400 is performed by a control circuit in the memory die 292. In one embodiment, the process 1400 is performed by a control circuit in the control die 590. In one embodiment, the process 1400 is performed by a control circuit (e.g., host processor 122) in the host 122. Reference will be made to the cross-point array depicted on FIG. 13 to discuss process 1400; however, process 1400 is not limited to the array depicted in FIG. 13.

Step 1402 includes applying a select voltage to a selected second conductive line 1208. With reference to FIG. 13, $V_{select}$ is applied by voltage driver 1212b to second conductive line 1208b. Step 1402 may also include applying an unselect voltage to unselected second conductive lines 1208. With reference to FIG. 13, $V_{unset}$ is applied by voltage driver 1212a to second conductive line 1208a, by voltage driver 1212c to second conductive line 1208c, and by voltage driver 1212d to second conductive line 1208d. In some embodiments, the second conductive lines are bit lines.

Step 1404 includes driving an access current separately through each selected first conductive line 1206 to concurrently drive the access current separately through each selected memory cell. Note that the access current could flow in either direction through the first conductive line 1206, depending on whether the access current is defined as having a positive or a negative magnitude. The access current is driven through the memory cells while the select voltage is applied to the selected second conductive line. With reference to FIG. 13, $I_{access}$ is driven by current driver 1210b through selected first conductive line 1206b to drive $I_{access}$ through memory cell 701a. At about the same time, $I_{access}$ is driven by current driver 1210g through selected first conductive line 1206g to drive $I_{access}$ through memory cell 701b. Thus, $I_{access}$ is currently driven separately through multiple selected memory cells in the cross-point array.

In one embodiment, the access current in step 1404 is used to concurrently read the memory cells. Hence, the access current may be referred to as a read current. In this case, process 1500 may further include sensing a voltage on each respective selected first conductive line 1206 in order to concurrently read each memory cell.

In one embodiment, the access current in step 1404 is used to concurrently write the memory cells. Hence, the access current may be referred to as a write current. In one embodiment, the access current will change an MRAM cell from the P-state to the AP-state. Hence, multiple MRAM cells in the cross-point array may be concurrently programmed from the P-state to the AP-state. In one embodiment, the access current will change an MRAM cell from the AP-state to the P-state. Hence, multiple MRAM cells in the cross-point array may be concurrently programmed from the AP-state to the P-state. In some embodiments, the write operation is a two stage operation. In one embodiment, of an MRAM two stage write operation, a first stage places all selected memory cell into the AP-state. The second stage writes the appropriate MRAM cells from the AP-state to the P-state. Alternatively, the first stage could program to the P-state, and the second stage to the AP-state. As a further alternative, more than two WLs may be selected for the selected BL; thereby providing more than two bits per module. In one embodiment, four WLs are selected for the selected BL. In one embodiment, eight WLs are selected for the selected BL. Bandwidth may be increased by accessing more word lines per module, which may be facilitated by lowering the resistance of the tile wires through use of copper or by thickening or widening the tile wires.

Process 1400 may be used to concurrently access multiple memory cells in a cross-point array. In one embodiment, process 1400 is used to concurrently access two memory cells in a cross-point array. In one embodiment, process 1400 is used to concurrently access more than two memory cells in a cross-point array. In one embodiment, process 1400 is used to concurrently access more than pairs of memory cells in a cross-point array, where one member of a pair (e.g., memory cell 701a) is on one side of a bit line driver and another member of the pair is on the other side of the bit line driver (e.g., memory cell 701b). A number of different strategies may be used to select which memory cells in the cross-point array are concurrently accessed. With reference again to FIG. 13, in some embodiments, the selected memory cells are selected with respect to their locations relative to the bit line contact 1304. In one embodiment of concurrent access, there is one selected bit line and one or more pairs of selected word lines. For purpose of illustration, some examples in which there is one selected bit line and one pair of selected word lines will be discussed. In one embodiment, the pair of selected word lines are chosen based on the distance from the bit line contact 1304 of the selected bit line to the point at which the selected word line crosses the selected bit line. In one embodiment, the distance from the bit line contact 1304 of the selected bit line to the aforementioned crossing point is about the same for both members of the pair of selected word lines. Stated another way, the two members of the pair of selected word lines are equidistant from the connection point of the bit line contact to the respective points at which each member crosses the selected bit line. Herein, "equidistant" means "about the same distance." In one embodiment, the difference of distances is less than five percent. For example, with reference to FIG. 14, the pair could include word lines 1206*b* and 1206*g*. Alternatively, the pair could include word lines 1206*d* and 1206*e*. This strategy results in about the same IR drop between where the bit line contact 1304 connects to the selected bit line and where the selected bit line will connect to each respective selected memory cell.

A similar strategy to the aforementioned distance based example is based on the number of word lines between the selected word line and where the bit line contact 1304 connects to the selected bit line. In one embodiment, each member of the pair of word lines is "n" word lines away from the connection point at which the bit line contact 1304 connects to the selected bit line. For example, word lines 1206*b* and 1206*g* are each three word lines away from where the bit line contacts 1304 connect to the bit lines 1208 (this example counts the word lines 1206*b* and 1206*g* as one of the three word lines). Note that in some embodiments the word lines may be symmetrically spaced with respect to the location of the bit line contacts such that this strategy also leads to about the same IR drop between where the bit line contact 1304 connects to the selected bit line and where the selected bit line will connect to each respective selected memory cell.

In another distance based embodiment, the locations of the selected word lines are chosen in order to keep about the same total distance between where the bit line contact 1304 connects to the selected bit line and where the respective selected word lines cross the selected bit line. This will be explained by way of an example. With reference to FIG. 13, the word line pairs may be word lines 1206*a* and 1206*e*; word lines 1206*b* and 1206*f*; word lines 1206*c* and 1206*f*; and word lines 1206*d* and 1206*h*. This strategy may reduce the probability of shorts between WL used in the same codeword for error correction. In some cases, the location of the selected memory cell (and hence the location of the selected word line) impacts the reliability of the data stored in the memory cell. As one example, it may be that data stored in memory cells along word line 1206*a* is less reliable than data stored in memory cells along word line 1206*d*. Likewise, it may be that data stored in memory cells along word line 1206*h* is less reliable than data stored in memory cells along word line 1206*e*. This strategy may read lower bit error rate cells concurrently with higher bit error rate cells. In some embodiments, both of these bits of data are part of the same ECC codeword. If, instead, a memory cell along word line 1206*a* and a memory cell along word line 1206*b* were read concurrently, then two higher error rate bits may be read together, which increases the chances that decoding the codeword would fail. However, by mixing higher with lower error rate bits, a codeword is less likely to fail the error correction process. Hence, this strategy may improve decoding errors of codewords stored in the memory cells.

A similar strategy to the aforementioned total distance based example is based on the total number of word lines between the respective members of a pair of selected word lines and where the bit line contact 1304 connects to the selected bit line. In one embodiment, the total number of word lines is the same for each pair of selected word lines. With reference to FIG. 13, if the word line pairs are word lines 1206*a* and 1206*e*, word lines 1206*b* and 1206*f*, word lines 1206*c* and 1206*f*, and word lines 1206*d* and 1206*h*, then in each case there are a total of three word lines between the respective members of the pair of selected word lines and where the bit line contact 1304 connects to the selected bit line (this example does not count the selected word lines as one of the word lines that are "between" the respective members of a pair of selected word lines and where the bit line contact 1304 connects to the selected bit line).

In some embodiments, concurrent access of multiple memory cells in a cross-point array includes performing a self-referenced read (SRR). In one embodiment, a SRR read is used during a concurrent read of multiple memory cells in a cross-point array. In one embodiment, a SRR read is used during a concurrent write of multiple memory cells in a cross-point array. In one embodiment, the SRR read is used to concurrently place multiple MRAM cells into an AP-state.

Figure 15:
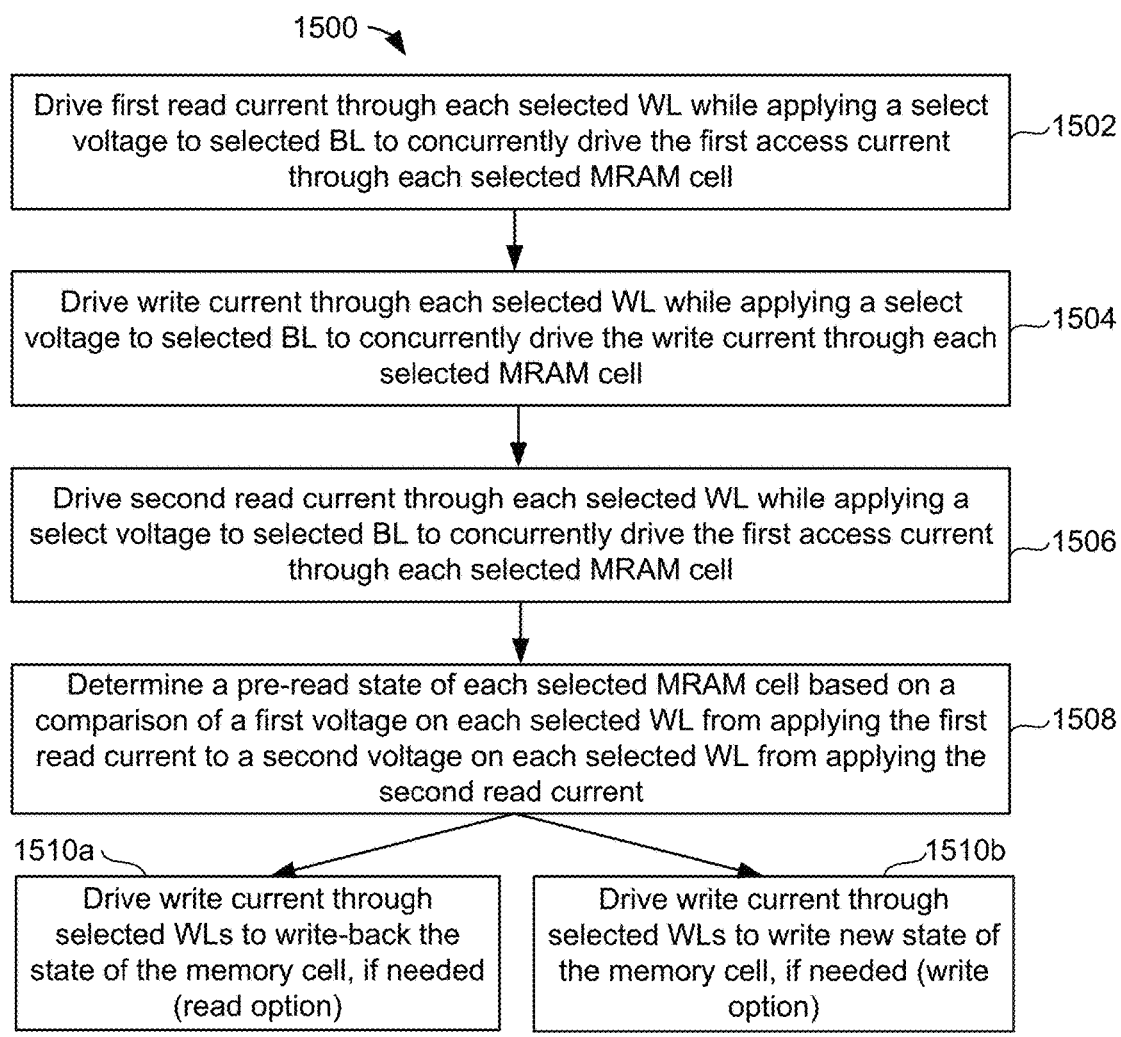
FIG. 15 is a flowchart depicting one embodiment of a process of concurrently accessing multiple memory cells in a cross-point array that includes performing an SSR.

FIG. 15 is a flowchart depicting one embodiment of a process 1500 of concurrently accessing multiple memory cells in a cross-point array that includes performing an SSR. The SRR may be referred to as a destructive SRR, which means that the original state of the memory cell may be changed during the SRR. In one embodiment, the process 1500 is performed to concurrently read multiple memory cells in a cross-point array. In one embodiment, the process 1500 is performed during a concurrent write of multiple memory cells in a cross-point array. In one embodiment, the process 1500 is performed by a control circuit in the memory die 292. In one embodiment, the process 1500 is performed by a control circuit in the control die 590. In one embodiment, the process 1500 is performed by a control circuit (e.g., host processor 122) in the host 122.

Figure 16A:
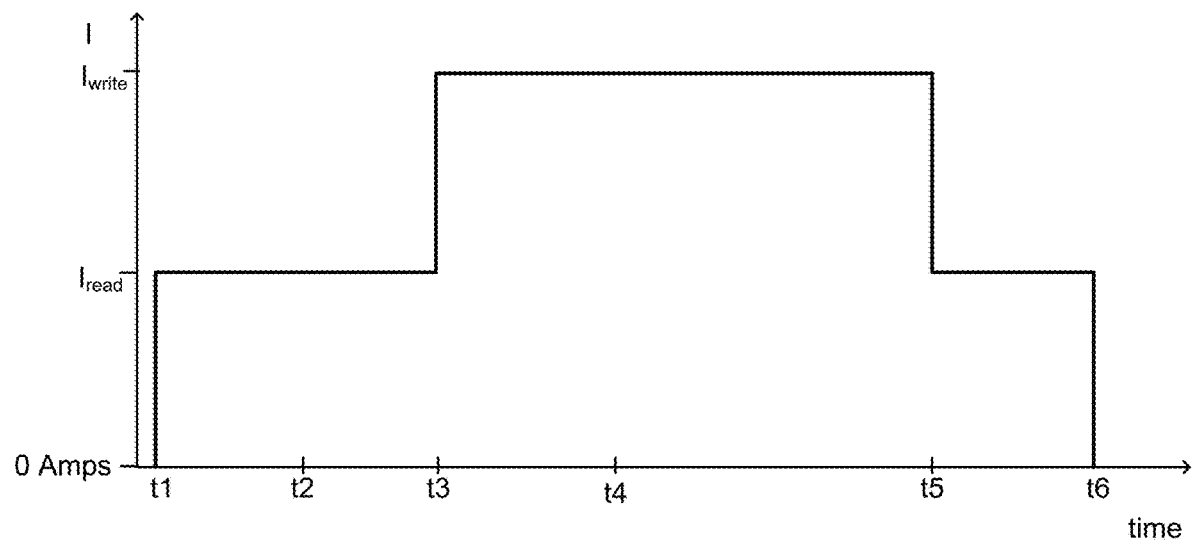
FIG. 16A depicts current versus time for the access current that is driven through the selected word lines during a SRR.
Figure 16B:
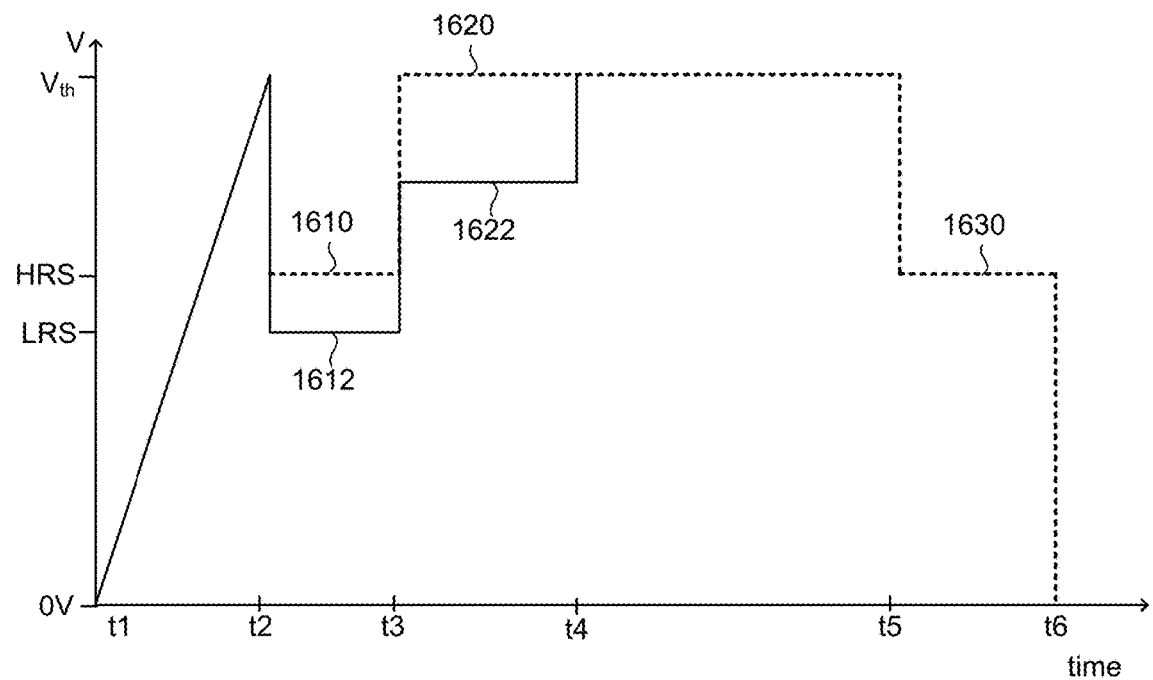
FIG. 16B depicts voltage versus time for the voltage across a selected MRAM cell during the SRR, and corresponds to FIG. 16A.

Reference will be made to the cross-point array depicted on FIG. 13 to discuss process 1500; however, process 1500 is not limited to the array depicted in FIG. 13. In process 1500, the memory cells are described as MRAM cells. However, the process 1500 may be used with other types of memory cells in cross-point arrays. Process 1500 will be discussed with reference to FIGS. 16A and 16B. FIG. 16A depicts current versus time for the access current that is driven through the selected word lines. FIG. 16B depicts voltage versus time for the voltage across a selected MRAM cell.

Step 1502 includes driving a first read current through each selected word line while applying a select voltage to a selected bit line in order to drive the first access current through each selected MRAM cell. With reference to FIG. 13, $I_{access}$ is driven by current driver 1210*b* through selected first conductive line 1206*b* to drive $I_{access}$ through memory cell 701*a* using a current of, for example, 15 ua. At about the same time, $I_{access}$ is driven by current driver 1210*g* through selected first conductive line 1206*g* to drive $I_{access}$ through memory cell 701*b*. With reference to FIG. 13, $V_{select}$ is applied by voltage driver 1212*b* to second conductive line 1208*b*. In one embodiment, $I_{access}$ is 15 μA and $V_{select}$ is 0V.

FIGS. 16A and 16B will now be discussed with respect to one MRAM cell 701 to further elaborate on step 1502. With reference to FIG. 16A, the access current is increased to $I_{read}$ at time t1 and is held at $I_{read}$ until t3. With reference to FIG. 16B, the voltage across the memory cell 701 increases from t1 to t2. The threshold switching selector 1204 is off between t1 and t2. Between t1 and t2, the access current causes the word line voltage to increase. The access current also supports any leakage in the path. Once the voltage across threshold switching selector 1204 reaches the threshold voltage $V_{th}$ of the threshold switching selector 1204, it will turn on and switch to a low resistance state (at t2). Thus, the voltage across the series combination of the threshold switching selector 1204 and the resistive MRAM element 1202 ramps up as the threshold switching selector is in an off state.

Once the threshold switching selector 1204 is in the on state (at t2), the $I_{read}$ current will flow through the selected memory cell 701. As the access current is held fixed at $I_{read}$, the voltage across the memory cell will drop to a level dependent upon the series resistance of the MRAM element 1202 and the on-state resistance of the threshold switching selector 1204. For a binary embodiment, the memory cell will have a high resistance, AP-state, and a low resistance, P-state. The resultant voltage across the series connected MRAM element 1202 and threshold switching selector 1204 in response to the $I_{read}$ current for the high resistance state (HRS) and low resistance state (LRS) are respectively shown as lines 1610 and 1612. Although the discussion here is in the context of an MRAM based memory cell being placed in series with the threshold switching selector, this read technique can similarly be applied to other programmable resistance memory cells, such as PCM or ReRAM devices.

Returning again to FIG. 15, step 1504 includes driving a write current through each selected word line while applying a select voltage to the selected bit line to concurrently drive the write current through each selected MRAM cell. With reference to FIG. 13, $I_{access}$ is driven by current driver 1210b through selected first conductive line 1206b to drive $I_{access}$ through memory cell 701a. At about the same time, $I_{access}$ is driven by current driver 1210g through selected first conductive line 1206g to drive $I_{access}$ through memory cell 701b. With reference to FIG. 13, $V_{select}$ is applied by voltage driver 1212b to second conductive line 1208b. In one embodiment, $I_{access}$ to write is 30 μA and $V_{select}$ is 0V.

FIGS. 16A and 16B will now be discussed with respect to one MRAM cell 701 to further elaborate on step 1504. With reference to FIG. 16A, the access current is increased to $I_{write}$ at time t3 and is held at $I_{write}$ until t5. With reference to FIG. 16B, at t3 the voltage across the MRAM cell 701 increases at t3. If the MRAM cell 701 was in the HRS (line 1610), then the voltage across the MRAM cell will increase to the level indicated by line 1620 at t3 and stay there until t5. Recall that the HRS is the AP-state. Thus, this MRAM cell will stay in the AP-state.

If the MRAM cell 701 was in the LRS (line 1612), then the voltage across the MRAM cell will increase to the level indicated by line 1622 at t3. Recall that the LRS is the P-state. If the MRAM cell 701 was in the P-state, it will switch to the AP-state. FIG. 16B shows line 1622 increases at t4 to meet with line 1620. This represents the MRAM cell has switched from the P-state (LRS) to the AP-state (HRS).

Returning again to FIG. 15, step 1506 includes driving a second read current through each selected word line while applying a select voltage to the selected bit line in order to drive the second access current through each selected MRAM cell. In one embodiment, the second access current has the same direction and substantially the same magnitude as the first access current. With reference to FIG. 13, $I_{access}$ is driven by current driver 1210b through selected first conductive line 1206b to drive $I_{access}$ through memory cell 701a. At about the same time, $I_{access}$ is driven by current driver 1210g through selected first conductive line 1206g to drive $I_{access}$ through memory cell 701b. With reference to FIG. 13, $V_{select}$ is applied by voltage driver 1212b to second conductive line 1208b. In one embodiment, $I_{access}$ is 15 μA and $V_{select}$ is 0V.

FIGS. 16A and 16B will now be discussed with respect to one MRAM cell 701 to further elaborate on step 1506. With reference to FIG. 16A, the access current is decreased from $I_{write}$ to $I_{read}$ at time t5 and is held at $I_{read}$ until t6. With reference to FIG. 16B, the voltage across the memory cell 701 decreases at t5 to the level indicated by 1630 and holds at that level until t6. Note that line 1630 is at the HRS level. Also recall that regardless of the initial state of the MRAM cell, the MRAM cell was placed into the HRS state (AP-state) in step 1504.

Returning again to FIG. 15, step 1508 includes determining a pre-read state of each selected MRAM cell based on a comparison of a first voltage on each selected word line from driving the first read current through the selected word line to a second voltage on each selected word line from driving the second read current through the selected word line.

FIGS. 16A and 16B will now be discussed with respect to one MRAM cell 701 to further elaborate on step 1508. The first voltage on the selected word line from applying the first read current will be the voltage between t2 and t3. Hence, the first voltage is either the HRS level 1610 or the LRS level 1612. Note that this first voltage may be stored in step 1504 by, for example, charging a sense capacitor using the word line voltage. The second voltage on the selected word line from applying the second read current will be the voltage between t5 and t6. This second voltage will typically be at about the HRS level 1610. However, the second voltage could be slightly different from the HRS level 1610. Comparing the first voltage with the second voltage may thus be used to determine whether the MRAM cell was at the HRS level 1610 or the LRS level 1612 between t2 and t3. To facilitate comparison, the level generated by the Read1 current to AP is stored and bumped positive by about half the voltage difference between HRS and LRS. Alternatively, the level may be bumped negative if Read1 current is to P. These choices may be reversed depending on MRAM cell orientation as will be apparent to one reasonably skilled in the art.

Returning again to FIG. 15, after step 1508 the process 1500 has two options. Step 1510a is a read option. Step 1510a includes driving a write current through selected word lines 1206 to write back the original state of the memory cell, if needed. Recall that step 1504 placed all MRAM cells in the AP-state. Hence, all MRAM cells that were originally in the P-state are written back to the P-state, in step 1510a. All MRAM cells that were originally in the AP-state are left in the AP-state, in step 1510a.

Step 1510b is a write option. Step 1510b includes driving a write current through selected word lines 1206 to write the new state of the memory cell, if needed. As noted, step 1504 placed all MRAM cells in the AP-state. Hence, all MRAM cells that are to be written to the P-state, regardless of their original state, are written to the P-state, in step 1510b. All MRAM cells that are to be written to the AP-state are left in the AP-state, in step 1510b.

Figure 17:
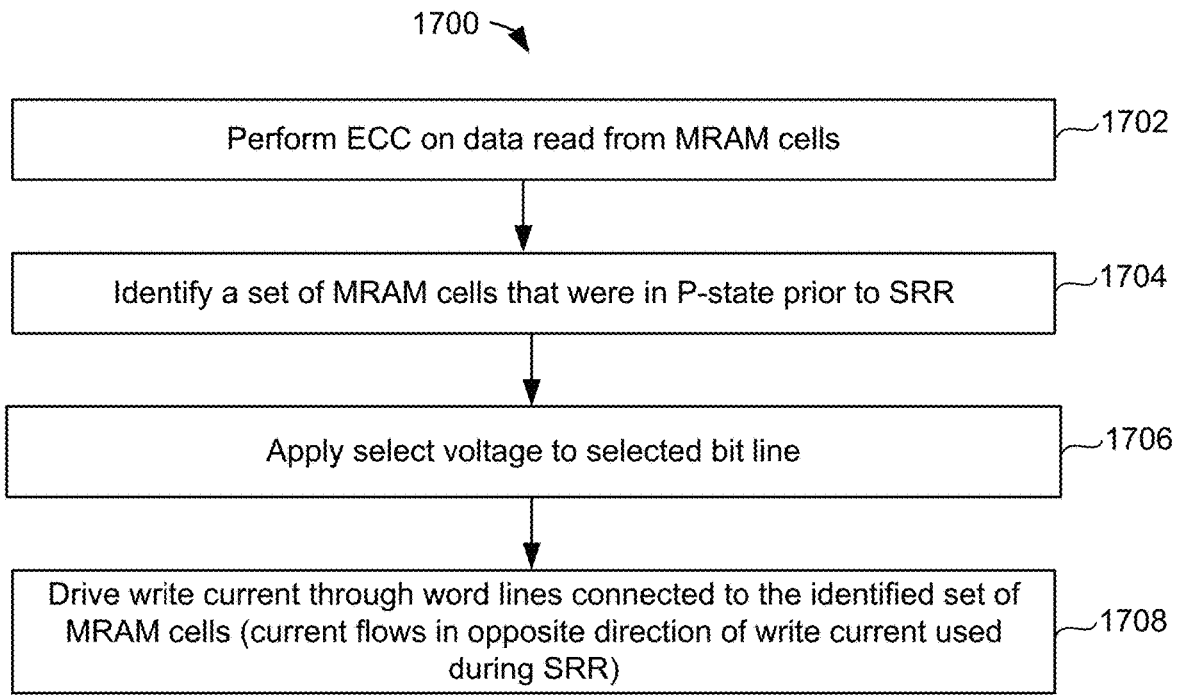
FIG. 17 depicts a flowchart of a process for writing back data to MRAM cells after a destructive SRR.

FIG. 17 depicts a flowchart of a process 1700 for writing back data to MRAM cells after a destructive SRR. Process 1700 provides further details for one embodiment of step 1510a. Step 1702 includes performing ECC on data that was read from the MRAM cells. Process 1500 may concurrently read multiple bits of a codeword from a single cross-point array. In some cases, other bits of the codeword are stored in other cross-point arrays. In one embodiment, system control logic 560 on either memory die 292 or control die 590 reads multiple cross-point arrays in order to obtain all of the bits of the codeword. In one embodiment, system control logic 560 sends the bits of the codeword to the memory controller 102, which decodes the codeword. In some embodiments, the control die 590 decodes the codeword. Regardless of where the decoding is performed, any errors in the data are corrected.

Step 1704 includes identifying a set of the MRAM cells that were in the P-state prior to the destructive SRR. In one embodiment, step 1704 is performed by system control logic 560 on either memory die 292 or control die 590. This identification may be made based on results of step 1508 of process 1500.

Step 1706 includes applying a select voltage to the selected bit line. Step 1708 includes driving a write current through word lines connected to the identified set of MRAM cells. In one embodiment, $I_{access}$ is −30 μA and $V_{select}$ is 0V. In step 1708, the current flows through the MRAM cells in the opposite direction as the current flowed in step 1504 of process 1500. Thus, whereas step 1504 was used to place MRAM cells into the AP-state, step 1708 is used to place MRAM cells into the P-state.

Figure 18:
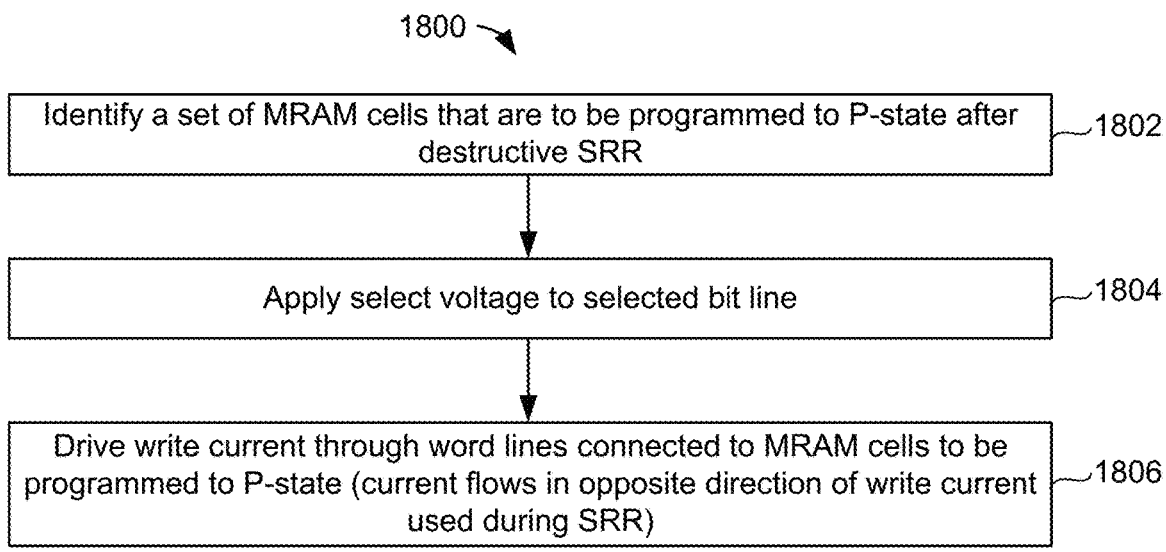
FIG. 18 depicts a flowchart of a process of a second stage of writing data to MRAM cells.

FIG. 18 depicts a flowchart of a process 1800 of a second stage of writing data to MRAM cells. Process 1800 provides further details for one embodiment of step 1510b. Step 1802 includes identifying a set of the MRAM cells that are to be programmed to the P-state after the destructive SRR. In one embodiment, step 1802 is performed by system control logic 560 on either memory die 292 or control die 590. This identification may be made based on data that is sent to the system control logic 560 by the memory controller 102. For example, the system control logic 560 may determine that MRAM cells to store a "0" are to be programmed to the AP-state and that memory cells to store a "1" are to be programmed to the P-state.

Step 1804 includes applying a select voltage to the selected bit line. Step 1806 includes driving a write current through word lines connected to the identified set of MRAM cells. In one embodiment, $I_{access}$ is −30 μA and $V_{select}$ is 0V. In step 1806, the current flows through the MRAM cells in the opposite direction as the current flowed in step 1504 of process 1500. Thus, whereas step 1504 was used to place MRAM cells into the AP-state, step 1806 is used to place MRAM cells into the P-state.

Figure 19A:
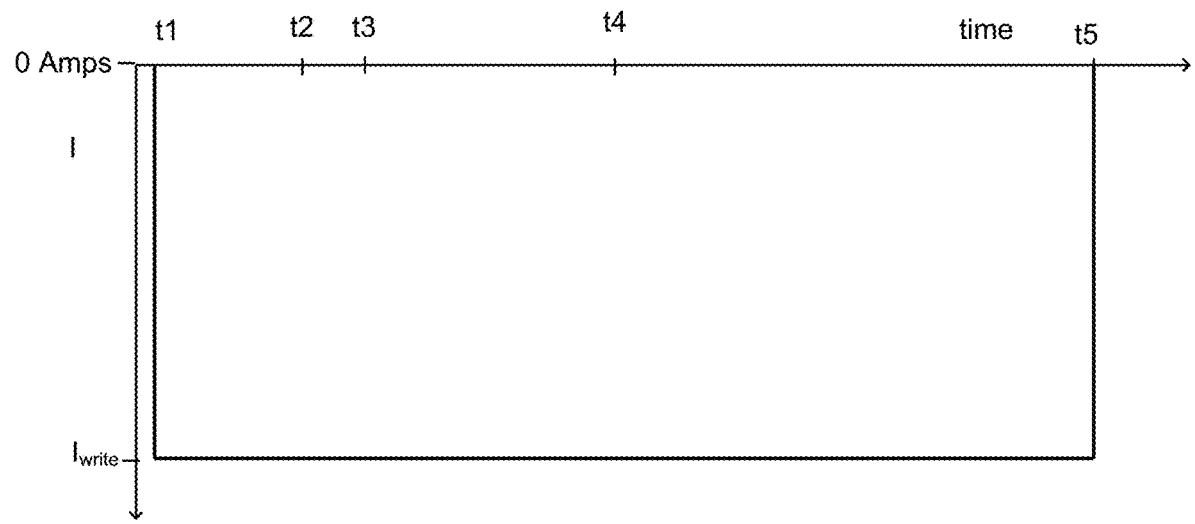
FIG. 19A depicts write current versus time for a write current that is provided to a selected word line.
Figure 19B:
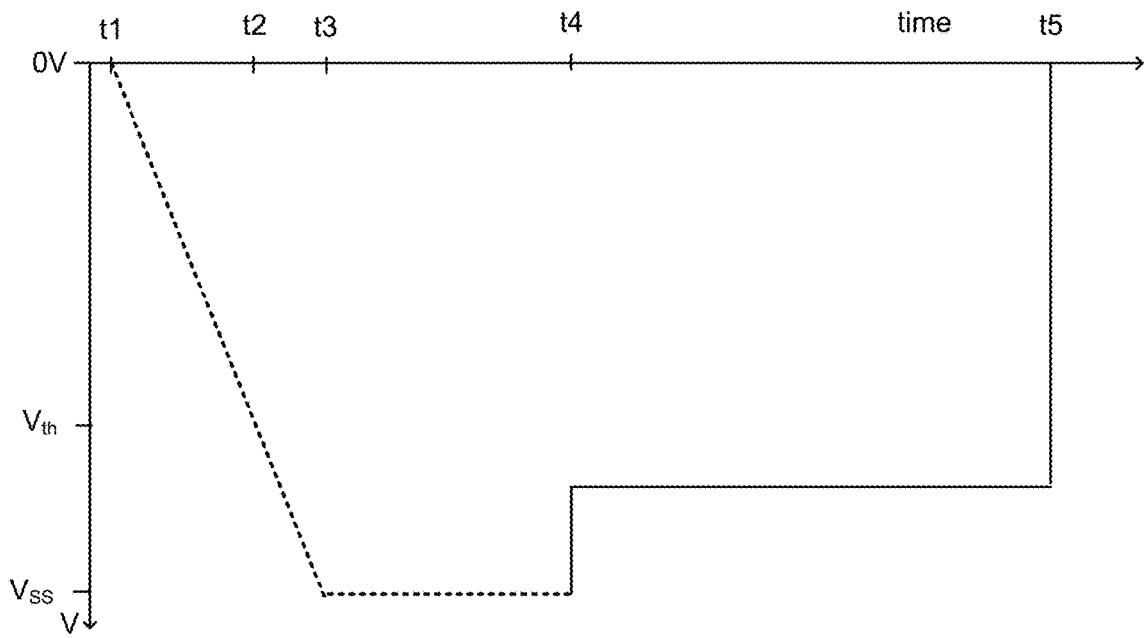
FIG. 19B depicts voltage across the MRAM cell versus time, and corresponds to FIG. 19A.

FIGS. 19A and 19B depict timing diagrams used during a write of MRAM cells. The timing diagrams can be applied to either process 1700 or 1800. FIG. 19A depicts current versus time for the current that is driven through a selected word line. FIG. 19B depicts voltage across the MRAM cell versus time. The timing diagrams are similar to those of FIGS. 16A and 16B and, in some embodiments, represent the timing that follows the timing diagrams for the SRR. Thus, for FIGS. 19A and 19B is assumed that the MRAM cell is in the AP-state at time t1. At time t1, the current provided to the selected word line drops from 0A to the $I_{write}$ level. In FIG. 19A, $I_{write}$ is represented as a negative value. For example, whereas $I_{write}$ may be 30 μA in FIG. 16A, $I_{write}$ may be −30 μA in FIG. 19A. The access current is held at $I_{write}$ from t1 until t5. Note that, as defined herein, this negative magnitude access current may flow from the selected word line 1206 to the current driver 1210. In other words, the current driver 1210 sinks the access current in the example of FIG. 19A. As defined herein, this is an example of driving a negative current through the word line.

With reference to FIG. 19B, between t1 and t3, the voltage across the MRAM drops from 0V to $V_{ss}$. The threshold switching selector 1204 is off between t1 and t2. Once the voltage across threshold switching selector 1204 reaches the threshold voltage $V_{th}$ of the threshold switching selector 1204, it will turn on and switch to a low resistance state (at t2). After the threshold switching selector 1204 turns on the voltage across the MRAM cell may continue to decrease. By time t3, the voltage across the MRAM cell is at a steady state value ($V_{ss}$). Also, after time t2, all of $I_{write}$ passes through the MRAM cell. At time t4 the MRAM cell switched from the AP-state to the P-state. Because the P-state is a lower resistance state than the AP-state, the absolute magnitude of the voltage across the MRAM cell drops at t4. In other words, the voltage across the MRAM cell moves closer to 0V at t4.

In one embodiment, MRAM cells in a cross-point array are concurrently written by first concurrently writing all selected MRAM cells in the cross-point array to the AP-state. Then, a set of the selected MRAM cells are concurrently written from the AP-state to the P-state. This technique can be modified to first concurrently write all selected MRAM cells in the cross-point array to the P-state. Then, a set of the selected MRAM cells are concurrently written from the P-state to the AP-state.

Figure 20:
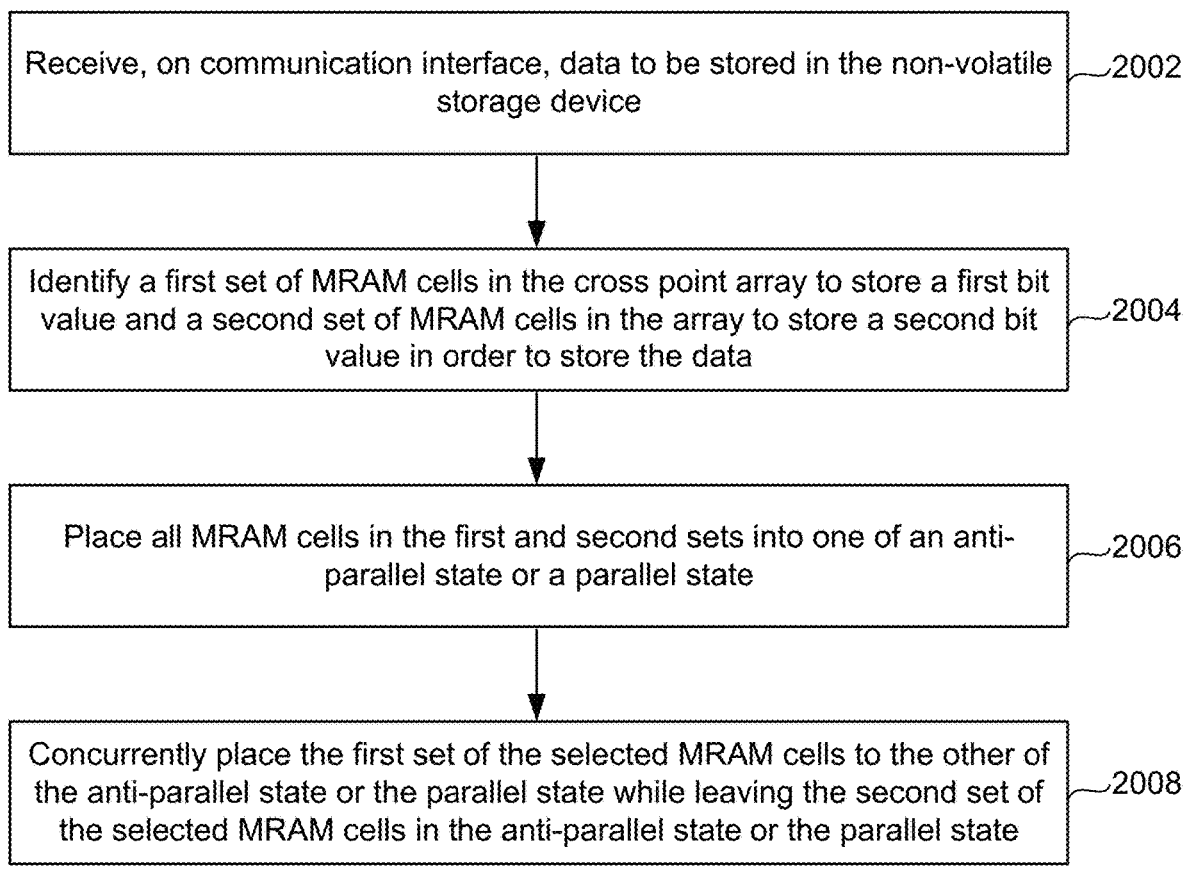
FIG. 20 is a flowchart of a process of concurrently writing MRAM cells in which all selected MRAM cells are first written to one of the AP-state or the P-state.

FIG. 20 is a flowchart of a process 2000 of concurrently writing MRAM cells in which all selected MRAM cells are first written to one of the AP-state or the P-state. In one embodiment, the process 2000 is performed by a control circuit in the memory die 292. In one embodiment, the process 2000 is performed by a control circuit in the control die 590. In one embodiment, the process 2000 is performed by a control circuit (e.g., host processor 122) in the host 120.

Step 2002 includes receiving, on a communication interface 568, data to be stored in the non-volatile storage device. In one embodiment, the memory die 292 receives the data from the memory controller 102. In one embodiment, the control die 590 receives the data from the memory controller 102.

Step 2004 includes identifying a first set of MRAM cells 701 in the cross-point array to store a first bit value and a second set of MRAM cells 701 in the cross-point array to store a second bit value in order to store the data. The first set of MRAM cells 701 and the second set of MRAM cells 701 represent all selected MRAM cells 701 in the cross-point array. In one embodiment, the first bit value is a "1" and the second bit value is a "0". In one embodiment, the first bit value is represented by the AP-state and the second bit value is represented by the P-state. Thus, a "1" may be represented by the AP-state and a "0" may be represented by the P-state; however, this mapping can be reversed.

Step 2006 includes placing all MRAM cells 701 in first and second sets into one of the AP-state or the P-state. Thus, either all selected MRAM cells 701 in the cross-point array are placed into one of the AP-state or the P-state. By this it is meant that either all selected MRAM cells 701 in the cross-point array are placed into the AP-state or, alternatively, all selected MRAM cells 701 in the cross-point array are placed into the P-state. In one embodiment, step 2006 includes performing at least a portion of an SRR. For example, step 2006 may include performing at least steps 1502-1504 of process 1500. In one embodiment, steps 1502-1506 are performed. In one embodiment, steps 1502-1508 are performed.

Step 2008 includes concurrently placing the first set of MRAM cells to the other of the AP-state or the P-state while leaving the second set MRAM cells in the one of the AP-state or the P-state. In one embodiment, the first set of MRAM cells has two of more cells, and the second set of MRAM cells has zero or more cells. In one embodiment, the first set of MRAM cells has zero of more cells, and the second set of MRAM cells has two or more cells. In one embodiment, the first set of MRAM cells has one of more cells, and the second set of MRAM cells has one or more cells.

The following two examples will be used to expand on steps 2006 to 2008. As one example, both the first and second sets of MRAM cells 701 in the cross-point array are placed into the AP-state in step 2006. In step 2008 of the first example, the first set of MRAM cells are written from the AP-state to the P-state, while leaving the second set of MRAM cells in the AP-state. As a second example, both the first and second sets of MRAM cells 701 in the cross-point array are placed into the P-state in step 2006. In step 2008 of the second example, the first set of MRAM cells are written from the P-state to the AP-state, while leaving the second set of MRAM cells in the P-state.

In some embodiments, concurrent access of MRAM cells is implemented in a cross-point array used in DRAM/ReRAM/MRAM 106. In some embodiments, MRAM operations can be mapped to DRAM commands. In particular, MRAM operations of concurrent read or concurrent write in a cross-point array can be mapped to DRAM commands.

Figure 21:
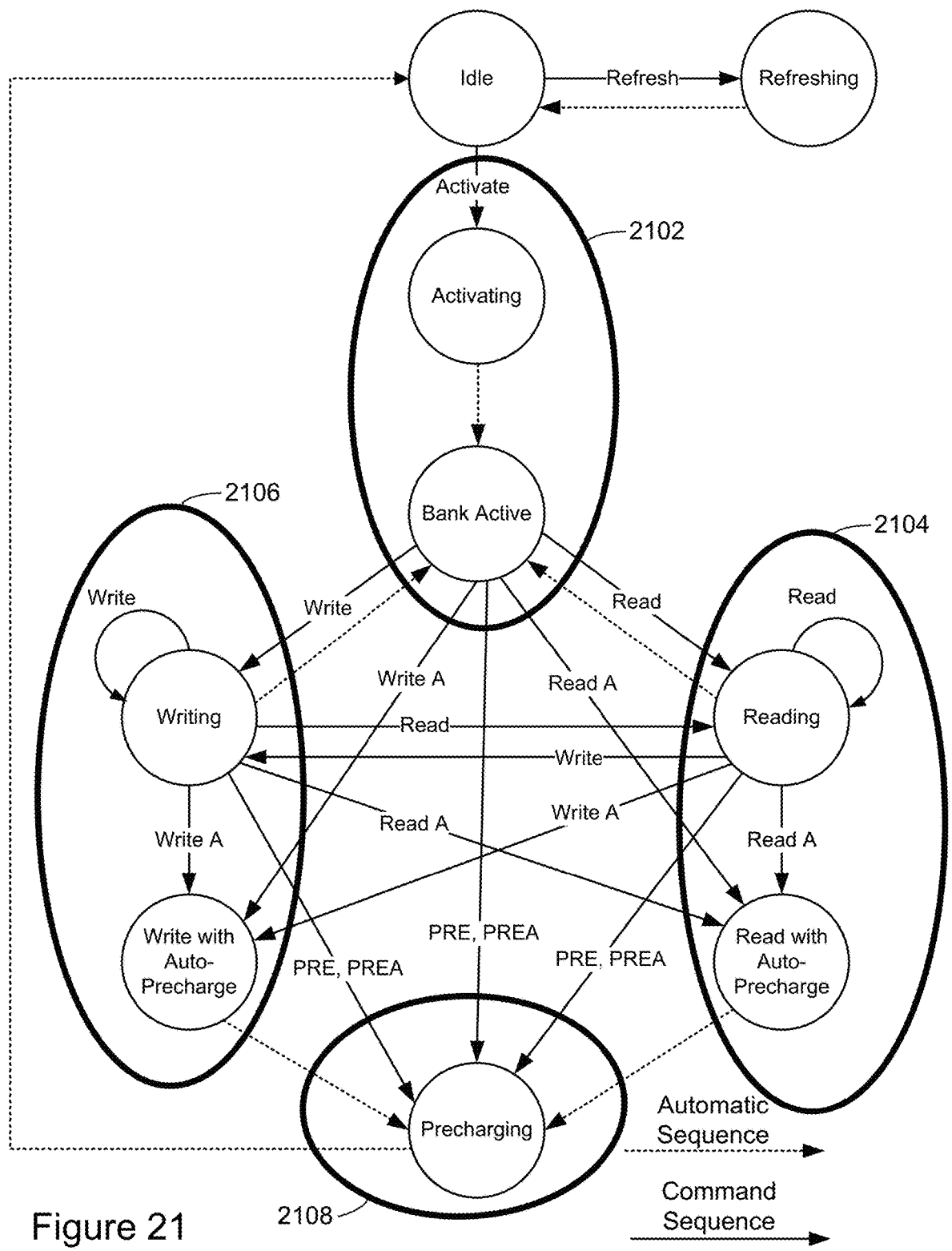
FIG. 21 is a state diagram representing DRAM commands, showing how MRAM operations can be mapped to DRAM commands.

FIG. 21 is a state diagram representing DRAM commands, showing how MRAM operations can be mapped to DRAM commands. DRAM command sequences are depicted by solid arrows. DRAM automatic sequences are depicted by dashed arrows. The diagram is somewhat simplified by omitting actions such as ZQ calibration and power downs. A mapping between MRAM operations and the DRAM commands is represented by ovals 2102, 2104, 2106, and 2108.

Oval 2102 is a DRAM activate. In one embodiment, the oval 2102 corresponds to at least a portion of an SRR. Note that this could be an SRR in an MRAM read operation or an SRR in an MRAM write operation, as discussed herein. With reference to FIG. 15, oval 2102 may correspond to steps 1502-1508. If this is a read operation, ECC may be performed on the data (see step 1702 in process 1700). In one embodiment, the MRAM read or write places all selected memory cells into the AP-state. In one embodiment, the current applied to the selected word line(s) is as depicted in FIG. 16A. In one embodiment, the voltage that appears across the selected MRAM cell(s) is as depicted in FIG. 16B.

Oval 2104 is a DRAM read. In one embodiment, this corresponds to MRAM operations of sending the ECC corrected data from the memory controller 102 to either the memory die 292 or control die 590.

Oval 2106 is a DRAM write. In one embodiment, this corresponds to MRAM operations of either the memory die 292 or control die 590 reading in data that was sent from the memory controller 102.

Oval 2108 is a DRAM pre-charge. This may correspond to either an MRAM read operation or an MRAM write operation. If this is an MRAM read operation, this may correspond to the write back (see step 1510a in FIG. 15). If this is an MRAM write operation, this may correspond to the write (see step 1510b in FIG. 15). In one embodiment, the MRAM read or write (corresponding to the DRAM pre-charge) operates only on memory cells that need to be in the P-state. Note that there is no need to perform any P-state to AP-state writing at this stage, as the MRAM cells were placed into the AP-state in the DRAM activate discussed above (oval 2102). In one embodiment, the current applied to the selected word line(s) is as depicted in FIG. 19A. In one embodiment, the voltage that appears across the selected MRAM cell(s) is as depicted in FIG. 19B.

According to a first aspect, an apparatus comprises a control circuit configured to connect to a cross-point array. The cross-point array comprises a plurality of first conductive lines, a plurality of second conductive lines, and a plurality of non-volatile memory cells each connected between one of the first conductive lines and a corresponding one of the second conductive lines. The control circuit is configured to concurrently access selected memory cells in the cross-point array. Each selected memory cell is connected between a selected second conductive line and a different selected first conductive line. Concurrently accessing the selected memory cells comprises the control circuit applying a select voltage to the selected second conductive line, and while the select voltage is applied to the selected second conductive line, driving an access current separately through each selected first conductive line to concurrently drive the access current separately through each selected memory cell.

In a second aspect, and in furtherance of the first aspect, the memory cells each comprise a magnetoresistive random access memory (MRAM) element.

In a third aspect, and in furtherance of the second aspect, the apparatus further comprises the further comprises the cross-point array. Each respective memory cell further comprises a threshold switching selector configured to become conductive in response to application of a voltage level exceeding a threshold voltage of the threshold switching selector, the threshold switching selector connected in series with the MRAM element of the respective memory cell. The control circuit is further configured to drive the access current through each selected first conductive line to turn on the threshold switching selector in each respective selected memory cell to thereby concurrently drive the access current through the MRAM element in each respective selected memory cell.

In a fourth aspect, and in furtherance of the second or third aspects, the control circuit concurrently accessing the selected memory cells in the cross-point array comprises the control circuit performing a concurrent write by: identifying a set of the selected memory cells to be programmed to one of an anti-parallel state or a parallel state; performing a destructive self-referenced read that concurrently places the MRAM element in all selected memory cells into the other of the anti-parallel state or the parallel state; and concurrently placing the MRAM element in the identified set of the selected memory cells to the one of the anti-parallel state or the parallel state after performing the destructive self-referenced read.

In a fifth aspect, and in furtherance of the any of the second to fourth aspects, the control circuit concurrently accessing the selected memory cells in the cross-point array comprises the control circuit performing a concurrent read by: performing a destructive self-referenced read that concurrently places the MRAM element in all selected memory cells into one of an anti-parallel state or a parallel state; identifying a set of the selected memory cells that were in the other of the anti-parallel state or the parallel state prior to the destructive self-referenced read; and concurrently placing the MRAM element in the set of the selected memory cells to the other of the anti-parallel state or the parallel state after performing the destructive self-referenced read.

In a sixth aspect, and in furtherance of the any of the first to fifth aspects, the apparatus further comprises the further comprises the cross-point array and a voltage driver connected to the selected second conductive line by a contact that is located at a connection point that divides the selected second conductive line into a first portion and a second portion. The voltage driver is configured to provide the select voltage to the selected second conductive line, the plurality of first conductive lines having a first set of first conductive lines that cross the first portion of the selected second conductive line and a second set of first conductive lines that cross the second portion of the selected second conductive line. The first conductive lines include one or more pairs of first conductive lines each having a first member that crosses the first portion of the selected second conductive line and a second member that crosses the second portion of the selected second conductive line.

In a seventh aspect, and in furtherance of the sixth aspect, a first number of the first conductive lines cross the first portion of the selected second conductive line and a second number of the first conductive lines cross the second portion of the selected second conductive line, the first number is equal to the second number. The first member of each pair of first conductive lines is "n" word lines away from the connection point and the second member of each pair of first conductive lines is "n" word lines away from the connection point.

In an eighth aspect, and in furtherance of the sixth aspect, the first member and the second member of each of the one or more pairs of the first conductive lines are equidistant from the connection point to respective points at which the first member and the second member cross the selected second conductive line.

In a ninth aspect, and in furtherance of the sixth aspect, the apparatus further comprises a communication configured to receive requests from a memory controller to access the cross-point array. The control circuit is further configured to select other pairs of the first conductive lines in response to the requests received on the communication interface, each other pair of the first conductive lines are connected to memory cells to be concurrently accessed in response to one of the requests. The control circuit is further configured to select the pair for each request such that a sum of a first distance from the connection point to a first point at which the first member crosses the selected second conductive line and a second distance from the connection point to a second point at which the second member crosses the selected second conductive line is substantially the same for all of the other pairs of the first conductive lines.

In a tenth aspect, and in furtherance of any of the first to ninth aspects, the plurality of second conductive lines comprise bit lines. The plurality of first conductive lines comprise a first set of word lines in a first layer of the cross-point array and a second set of word lines in a second layer of the cross-point array, wherein the selected first conductive lines comprise a first word line in the first layer and a second word line in the second layer.

In additional aspects, a method of multi-bit access of magnetoresistive random access memory (MRAM) cells in a cross-point array comprises driving a first read current through each of selected word lines in the cross-point array while applying a first select voltage to a selected bit line in the cross-point array to concurrently and separately drive the first read current through a plurality of selected MRAM cells. Each selected MRAM cell resides between the selected bit line and a corresponding one of the selected word lines. The method comprises driving a write current separately through each selected word line while applying a second select voltage to the selected bit line to concurrently and separately drive the write current through the plurality of selected MRAM cells to place each selected MRAM cell into one of an anti-parallel state or a parallel state. The method comprises driving a second read current through each selected word line while applying the first select voltage to the selected bit line to concurrently and separately drive the second read current through the plurality of selected MRAM cells. The method comprises determining a pre-read state of each selected MRAM cell based on a comparison of a first voltage on each selected word line that results from driving the first read current through each selected MRAM cell to a second voltage on each selected word line that results from driving the second read current through each selected MRAM cell.

In another set of aspects, a memory system comprises a communication interface, a cross-point array, and a control circuit coupled to the communication interface and the cross-point array. The cross-point array comprises a plurality of word lines, a plurality of bit lines, and a plurality of magnetoresistive random access memory (MRAM) cells. Each MRAM cell resides between a cross-point of one of the plurality word lines and a corresponding one of the plurality of bit lines. The control circuit is configured to receive, on the communication interface, data to be stored in the memory system. The control circuit is configured to identify a first set of two or more the MRAM cells to store a first bit value and a second set of zero or more of the MRAM cells to store a second bit value in order to store at least a portion of the data. The control circuit is configured to concurrently place both the first set of the MRAM cells and the second set of the MRAM cells into one of an anti-parallel state or a parallel state. The control circuit is configured to concurrently place the first set of the MRAM cells to the other of the anti-parallel state or the parallel state while leaving the second set of the MRAM cells in the one of the anti-parallel state or the parallel state.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
one or more control circuits configured to connect to a cross-point array comprising a plurality of first conductive lines, a plurality of second conductive lines, and a plurality of programmable resistance memory cells, each memory cell connected at a cross-point junction between one of the first conductive lines and a corresponding one of the second conductive lines, the one or more control circuits configured to concurrently write selected memory cells in the cross-point array, wherein each selected memory cell is connected between a same selected first conductive line and a different selected second conductive line, the one or more control circuits configured to:
apply a select voltage to the selected first conductive line;
drive first fixed magnitude write currents having a first polarity separately through each selected second conductive line in a first set of the second conductive lines while the select voltage is applied to the selected first conductive line to concurrently drive the first write currents separately through each selected memory cell in a first set of the selected memory cells to concurrently write the selected memory cells in the first set to a first state; and
drive second fixed magnitude write currents having a second polarity opposite the first polarity separately through each selected second conductive line in a second set of the second conductive lines while the select voltage is applied to the selected first conductive line to concurrently drive the second write currents separately through each selected memory cell in a second set of the selected memory cells to concurrently write the selected memory cells in the second set to a second state at a different time than concurrently writing the selected memory cells in the first set to the first state.

2. The apparatus of claim 1, further comprising the cross-point array, wherein the programmable resistance memory cells each comprise a magnetoresistive random access memory (MRAM) element.

3. The apparatus of claim 2, further comprising the cross-point array, wherein:
the MRAM element comprises a magnetic tunnel junction (MTJ) comprising a free magnetic layer and a reference magnetic layer; and
the first write currents are configured to concurrently change an orientation of the free magnetic layer with respect to the reference magnetic layer in the respective selected memory cells in the first set by a spin transfer torque (STT) effect.

4. The apparatus of claim 2, wherein:
each respective memory cell further comprises a threshold switching selector configured to become conductive in response to application of a voltage level exceeding a threshold voltage of the threshold switching selector, the threshold switching selector connected in series with the MRAM element of the respective memory cell; and
the one or more control circuits are further configured to concurrently drive the first write currents separately through each selected second conductive line in the first set of the second conductive lines while the select voltage is applied to the selected first conductive line to turn on the threshold switching selector in each respective selected memory cell in the first set of the selected memory cells to thereby concurrently drive the first write currents through the MRAM element in each respective selected memory cell in the first set of the selected memory cells.

5. The apparatus of claim 2, wherein to concurrently write the selected memory cells in the first set of the selected memory cells and to concurrently write the selected memory cells in the second set of the selected memory cells in the cross-point array the one or more control circuits are further configured to:
identify the first set of the selected memory cells to be programmed to an anti-parallel state;
concurrently place the MRAM element in all selected memory cells in the first set and the second set into a parallel state; and
concurrently place the MRAM element in the identified first set of the selected memory cells to the anti-parallel state after placing the MRAM element in all selected memory cells in the first set and the second set into the parallel state.

6. The apparatus of claim 2, wherein to concurrently write the selected memory cells in the first set of the selected memory cells and to concurrently write the selected memory cells in the second set of the selected memory cells in the cross-point array the one or more control circuits are further configured to:
identify the first set of the selected memory cells to be programmed to a parallel state;
concurrently place the MRAM element in all selected memory cells in the first set and the second set into an anti-parallel state; and
concurrently place the MRAM element in the identified first set of the selected memory cells to the parallel state after placing the MRAM element in all selected memory cells in the first set and the second set into the anti-parallel state.

7. The apparatus of claim 1, further comprising:
the cross-point array; and
a voltage driver connected to the selected first conductive line by a contact that is located at a connection point that divides the selected first conductive line into a first portion and a second portion, the voltage driver configured to provide the select voltage to the selected first conductive line, the plurality of second conductive lines having a third set of second conductive lines that cross the first portion of the selected first conductive line and a fourth set of second conductive lines that cross the second portion of the selected first conductive line;
wherein the second conductive lines include one or more pairs of second conductive lines each having a first member that crosses the first portion of the selected first conductive line and a second member that crosses the second portion of the selected first conductive line.

8. The apparatus of claim 1, further comprising the cross-point array, wherein the plurality of first conductive lines comprise bit lines, wherein the plurality of second conductive lines comprise a first set of word lines in a first layer of the cross-point array and a second set of word lines in a second layer of the cross-point array, wherein the selected second conductive lines in the first set of the second conductive lines comprise a first word line in the first layer and a second word line in the second layer, wherein the selected second conductive lines in the second set of the second conductive lines comprise a third word line in the first layer and a fourth word line in the second layer.

9. The apparatus of claim 1, further comprising:
a first semiconductor die that comprises the cross-point array; and
a second semiconductor die affixed to the first semiconductor die, wherein the second semiconductor die comprises the one or more control circuits.

10. The apparatus of claim 1, further comprising:
a semiconductor die that comprises the cross-point array and the one or more control circuits.

11. A method of multi-bit write of magnetoresistive random access memory (MRAM) cells in a cross-point array, comprising:
applying a select voltage to a selected first conductive line in the cross-point array, wherein the cross-point array comprises a plurality of first conductive lines, a plurality of second conductive lines, and a plurality of MRAM cells, each MRAM cell connected at a cross-point junction between one of the first conductive lines and a corresponding one of the second conductive lines, wherein each selected MRAM cell is connected between a same selected first conductive line and a different selected second conductive line;
driving, with one or more current drivers, first write currents having a first polarity separately through each selected second conductive line in a first set of the second conductive lines while the select voltage is applied to the selected first conductive line to concurrently drive the first write currents separately through each selected MRAM cell in a first set of selected MRAM cells to concurrently write the selected MRAM cells in the first set; and
driving, with one or more current drivers, second write currents having an opposite polarity as the first write currents separately through each selected second conductive line in a second set of the second conductive lines while the select voltage is applied to the selected first conductive line to concurrently drive the second write currents separately through each selected MRAM cell in a second set of selected MRAM cells to concurrently write the selected MRAM cells in the second set at a different time than concurrently writing the selected MRAM cells in the first set, wherein each selected MRAM cell resides between the selected first conductive line and a corresponding one of the selected second conductive lines.

12. A memory system, comprising:
a cross-point array comprising a plurality of word lines, a plurality of bit lines, and a plurality of magnetoresistive random access memory (MRAM) cells, wherein each MRAM cell resides between a cross-point of one of the plurality of word lines and a corresponding one of the plurality of bit lines; and
a control circuit coupled to the cross-point array, the control circuit configured to:
identify a first set of the plurality of the MRAM cells in the cross-point array to store a first bit value;
concurrently force first write currents separately through the first set of the MRAM cells to concurrently place the first set of the MRAM cells to either an anti-parallel state or a parallel state to concurrently store the first bit value in the first set of the MRAM cells;
identify a second set of the plurality of the MRAM cells in the cross-point array to store a second bit value; and
concurrently force second write currents separately through the second set of the MRAM cells to concurrently place the second set of the MRAM cells to the other of the anti-parallel state or the parallel state to concurrently store the second bit value in the second set of the MRAM cells at a different time than concurrently storing the first bit value in the first set of the MRAM cells, the second write currents have an opposite polarity of the first write currents.

13. The memory system of claim 12, wherein:
each MRAM cell comprises a magnetic tunnel junction (MTJ) comprising a free magnetic layer and a reference magnetic layer; and
the concurrent first write currents are configured to change an orientation of the free magnetic layer with respect to the reference magnetic layer in the respective MRAM cells by a spin transfer torque (STT) effect.

14. The memory system of claim 12, wherein the control circuit is further configured to:
concurrently force the first write currents separately through the first set of the MRAM cells to concurrently place the first set of the MRAM cells to the anti-parallel state to concurrently store the first bit value in the first set of the MRAM cells.

15. The memory system of claim 14, wherein:
the control circuit further is configured to
concurrently force the second write currents separately through the second set of the MRAM cells to concurrently place the second set of the MRAM cells to the parallel state to concurrently store the second bit value.

16. The memory system of claim 12, wherein the control circuit is further configured to:
concurrently force the first write currents separately through the first set of the MRAM cells to concurrently place the first set of the MRAM cells to the parallel state to concurrently store the first bit value in the first set of the MRAM cells.

17. The memory system of claim 16, wherein:
the control circuit further is configured to
concurrently force the second write currents separately through the second set of the MRAM cells to concurrently place the second plurality-set of the MRAM cells to the anti-parallel state to concurrently store the second bit value.

18. The memory system of claim 12, wherein:
each MRAM cell comprises an MRAM element connected in series with a threshold switching selector configured to become conductive in response to application of a voltage level exceeding a threshold voltage of the threshold switching selector;
the control circuit is further configured to drive the first write currents separately through a first set of selected word lines to turn on the threshold switching selector in each respective MRAM cell in the first set to thereby concurrently drive the first write currents separately through the MRAM element in each respective MRAM cell in the first set; and
the control circuit is further configured to drive the second write currents separately through a second set of selected word lines to turn on the threshold switching selector in each respective MRAM cell in the second set to thereby concurrently drive the second write currents separately through the MRAM element in each respective MRAM cell in the second set.

* * * * *